(12) United States Patent
Agee

(10) Patent No.: US 11,762,944 B2
(45) Date of Patent: *Sep. 19, 2023

(54) SUBSPACE-CONSTRAINED PARTIAL UPDATE METHODS FOR REDUCED-COMPLEXITY SIGNAL ESTIMATION, PARAMETER ESTIMATION, OR DATA DIMENSIONALITY REDUCTION

(71) Applicant: Brian G. Agee, San Jose, CA (US)

(72) Inventor: Brian G. Agee, San Jose, CA (US)

( * ) Notice: Subject to any disclaimer, the term of this patent is extended or adjusted under 35 U.S.C. 154(b) by 223 days.

This patent is subject to a terminal disclaimer.

(21) Appl. No.: 17/156,630

(22) Filed: Jan. 24, 2021

(65) Prior Publication Data
US 2021/0141855 A1    May 13, 2021

Related U.S. Application Data

(63) Continuation of application No. 15/883,359, filed on Jan. 30, 2018, now Pat. No. 10,902,086, which is a continuation of application No. 14/121,895, filed on Nov. 1, 2014, now Pat. No. 9,928,212.

(60) Provisional application No. 61/962,269, filed on Nov. 3, 2013.

(51) Int. Cl.
*G06F 17/14*     (2006.01)
*H03H 21/00*    (2006.01)
*G06F 17/16*     (2006.01)

(52) U.S. Cl.
CPC .............. *G06F 17/14* (2013.01); *G06F 17/16* (2013.01); *H03H 21/0012* (2013.01); *H03H 21/0043* (2013.01); *H03H 2021/0072* (2013.01)

(58) Field of Classification Search
CPC ........... H03H 21/0012; H03H 21/0043; H03H 2021/0072; G06F 17/14; G06F 17/16
USPC ....................................................... 708/322
See application file for complete search history.

(56) References Cited

U.S. PATENT DOCUMENTS

| | | |
|---|---|---|
| 4,422,175 A | 12/1983 | Bingham et al. |
| 5,225,210 A | 10/1993 | Gardner et al. |
| 5,260,968 A | 11/1993 | Gardner et al. |
| 5,299,148 A | 3/1994 | Gardner et al. |
| 5,477,534 A | 12/1995 | Kusano |
| 5,940,519 A | 8/1999 | Kuo |
| 5,991,418 A | 11/1999 | Kuo |
| 6,097,823 A | 8/2000 | Kuo |

(Continued)

OTHER PUBLICATIONS

M. Jin; "Partial updating RLS algorithm"; Proceedings 7th International Conference on Signal Processing, 2004. Proceedings. ICSP '04. 2004.

(Continued)

*Primary Examiner* — Tan V Mai
(74) *Attorney, Agent, or Firm* — Steven J Shattil

(57) ABSTRACT

An adaptive processor implements partial updates when it adjusts weights to optimize adaptation criteria in signal estimation, parameter estimation, or data dimensionality reduction algorithms. The adaptive processor designates some of the weights to be update weights and the other weights to be held weights. Unconstrained updates are performed on the update weights, whereas updates to the set of held weights are performed within a reduced-dimensionality subspace. Updates to the held weights and the update weights employ adapt-path operations for tuning the adaptive processor to process signal data during or after tuning.

23 Claims, 6 Drawing Sheets

(56) References Cited

U.S. PATENT DOCUMENTS

| | | | |
|---|---|---|---|
| 6,198,828 | B1 | 3/2001 | Kuo |
| 6,418,227 | B1 | 7/2002 | Kuo |
| 7,103,177 | B2 | 9/2006 | Tankikulu et al. |
| 7,293,055 | B2 | 9/2007 | McAdam et al. |
| 8,280,065 | B2 | 10/2012 | Nadjar et al. |
| 8,804,946 | B2 | 8/2014 | Mazurenko |
| 9,231,561 | B2 | 1/2016 | Choi |
| 9,928,212 | B2 | 3/2018 | Agee |
| 10,902,086 | B2 * | 1/2021 | Agee .................. H03H 21/0043 |
| 2004/0015529 | A1 | 1/2004 | Tanrikulu et al. |

OTHER PUBLICATIONS

S.C. Douglas; "Analysis and implementation of the max-NLMS adaptive filter"; Conference Record of The Twenty-Ninth Asilomar Conference on Signals, Systems and Computers, Oct. 30-Nov. 1, 1995.

K. Dogancay, et al.; "Selective-partial-update NLMS and affine projection algorithms for acoustic echo cancellation"; 2000 IEEE International Conference on Acoustics, Speech, and Signal Processing. Proceedings (Cat. No. 00CH37100), Jun. 5-9, 2000.

K. Dogancay, et al.; "Normalised constant modulus algorithm with selective partial updates"; 2001 IEEE International Conference on Acoustics, Speech, and Signal Processing. Proceedings (Cat. No. 01CH37221), May 7-11, 2001.

B.G Agee, et al.; "Spectral self-coherence restoral: a new approach to blind adaptive signal extraction using antenna arrays"; Proceedings of the IEEE, Year: 1990 | vol. 78, Issue: 4.

B.G. Agee, "Blind separation and capture of communication signals using a multitarget constant modulus beamformer"; IEEE Military Communications Conference, 'Bridging the Gap. Interoperability, Survivability, Security', Oct. 15-18, 1989.

D.L. Jones; "A normalized constant-modulus algorithm"; Conference Record of The Twenty-Ninth Asilomar Conference on Signals, Systems and Computers, Oct. 30-Nov. 1, 1995.

J. Nagumo, et al.; "A learning method for system identification"; IEEE Transactions on Automatic Control (vol. 12, Issue: 3, Jun. 1967).

G. Deng; "Partial update and sparse adaptive filters"; IET Signal Processing 1(1):9-17, Apr. 2007.

S.C. Douglas; "Adaptive filters employing partial updates"; IEEE Transactions on Circuits and Systems II: Analog and Digital Signal Processing (vol. 44, Issue: 3, Mar. 1997).

S.C. Douglas; "Simplified stochastic gradient adaptive filters using partial updating"; Proceedings of IEEE 6th Digital Signal Processing Workshop, Oct. 2-5, 1994.

M. Godavarti, et al.; "Partial update LMS algorithms"; IEEE Transactions on Signal Processing (vol. 53, Issue: 7, Jul. 2005).

S. Werner, et al.; "Partial-update NLMS algorithms with data-selective updating"; 2002 IEEE International Conference on Acoustics, Speech, and Signal Processing, May 13-17, 2002.

B. Xie, et al.; "Partial update EDS algorithms for adaptive filtering"; 2010 IEEE International Conference on Acoustics, Speech and Signal Processing, Mar. 14-19, 2010.

B.W. Kim, et al.; "A new efficient partial node update for wireless sensor networks using a simulated virtual node"; 2008 International Conference on Intelligent Sensors, Sensor Networks and Information Processing, Dec. 15-18, 2008.

D.L. Duttweiler; "Proportionate normalized least-mean-squares adaptation in echo cancelers"; IEEE Transactions on Speech and Audio Processing (vol. 8, Issue: 5, Sep. 2000).

S. Werner, et al.; "Energy-efficient distributed parameter estimation with partial updates"; The 2010 International Conference on Green Circuits and Systems, Jun. 21-23, 2010.

E. Zacarias, et al.; "Partial Update Adaptive Transmit Beamforming with Limited Feedback"; 2006 IEEE International Conference on Acoustics Speech and Signal Processing Proceedings, May 14-19, 2006.

B.G. Agee; "Fast acquisition of burst and transient signals using a predictive adaptive beamformer"; IEEE Military Communications Conference, 'Bridging the Gap. Interoperability, Survivability, Security', Oct. 15-18, 1989.

B.G. Agee; "Maximum-likelihood approaches to blind adaptive signal extraction using narrowband antenna arrays"; [1991] Conference Record of the Twenty-Fifth Asilomar Conference on Signals, Systems & Computers, Nov. 4-6, 1991.

N. Avesta; "Kalman-Based Periodic Coefficient Update for FIR Adaptive Filters"; 2007 IEEE International Conference an Multimedia and Expo, Jul. 2-5, 2007.

B. Agee; "The least-squares CMA: A new technique for rapid correction of constant modulus signals"; ICASSP '86. IEEE International Conference on Acoustics, Speech, and Signal Processing, Apr. 7-11, 1986.

* cited by examiner

SUBSPACE-CONSTRAINED PARTIAL UPDATE METHODS FOR REDUCED-COMPLEXITY SIGNAL ESTIMATION, PARAMETER ESTIMATION, OR DATA DIMENSIONALITY REDUCTION

CROSS REFERENCE TO RELATED APPLICATIONS

This application is a Continuation of U.S. patent application Ser. No. 15/883,359, filed Jan. 30, 2018, now U.S. Pat. No. 10,902,086, which is a Continuation of U.S. patent application Ser. No. 14/121,895, filed Nov. 1, 2014, now U.S. Pat. No. 9,928,212, which claims priority to U.S. Provisional Patent Application No. 61/962,269, filed Nov. 3, 2013, all of which are expressly incorporated by reference herein in their entirety and for all purposes.

FIELD OF THE INVENTION

The present invention relates generally to digital signal processing, with particular emphasis on devices employing one or more adaptive processors with large numbers of adaptation weights (also known as high-dimensionally, or highly-adaptive signal processors). Although referred to generally as "an adaptive signal processor" or as "an adaptive digital signal processor" ('digital' being generally understood to refer to the nature of the processing used by the computational aspect, while the signals are generally understood to be analog electromagnetic waveforms), this phrase covers any singleton or combination device (i.e., whether the 'processor' comprises a single element, or a non-zero set of interacting elements), and whether the device's digital processing aspect is entirely embodied in physical hardware, or in a combined form of hardware, special-purpose firmware, and general processing purpose software. The term 'adaptive' refers to processing that adjusts signal weights to the physical signal(s) transmitted, received, or both, by or through said adaptive processor, in order to optimize an adaptation criteria responsive to a functional purpose or the externalities (transient, temporary, situational, and even permanent) for that processor. Each adaptation criteria for the adaptive algorithm may be any of a signal or parameter estimation, measured quality, or any combination thereof.

BACKGROUND OF THE INVENTION

Highly dimensional adaptive processors (devices employing adaptive processors with large numbers of adaptation weights or parameters) are of interest for a wide variety of applications. These applications include:

Acoustic echo cancellers, where adaptive noise cancellers employing finite impulse response (FIR) filters with as many as 2,000 adaptively adjust filter taps are used to remove echoes induced in long-haul telephony networks.

Phased array and MIMO radar systems, where large arrays of antennas (10-1,000 elements/array) are used to electronically steer beams at detected targets and nulls at jammers and clutter sources, by combining signals received by the array and distributing signals transmitting to the array using large linear matrix operations.

Digital predistortion (DPD) processors, where nonlinear adaptive processors with large numbers of parameters (e.g., Volterra-series approximations of nonlinear processes) are used to adaptively learn, and digitally invert nonlinear effects added by high-power amplifiers.

Smart Grid networks employing spread spectrum modulation formats with large spreading factors and adaptive dispreading methods to separate large numbers of co-channel signals, and to detect and remove spoofers from the networks.

Massively MIMO cellular networks employing base stations with very large numbers of antenna arrays.

To effect adaptive signal processing in these applications, practical means for adjusting large numbers of weights must be developed and implemented. Techniques that have been developed in past to accomplish this include nonblind techniques that exploit a known reference signal (e.g., a training or pilot signal inserted into a signal transmitted to the adaptive processor); "partially blind" techniques that exploit a known reference signal with unknown effects added by the communication channel, e.g., delay caused by clock timing offset and physical distance between the transmitter and receiver, and carrier offset caused by LO offset and Doppler shift between the transmitter and receiver; and fully blind methods that only exploit general structure of the transmitted signal. In many systems, a reference signal can only be made available on a sparse basis, e.g., at the beginning of signal reception, after which the processor must operate using fixed weights without additional training between reference signal reception intervals.

These techniques can also be subdivided into methods with "order-M" (O(M)) or linear complexity, where the real multiply-and-accumulate (RMAC) operations per input data sample needed to adapt the processor is on the order of the number of weights M being adjusted by the processor, and methods with higher-order (e.g., $O(M^v)$, where $v>1$) complexity, where the RMAC's per data sample needed to adapt the processor rises much faster than the number of weights being adjusted by the processor. Typically, the most powerful and effective adaptive processing methods have complexity of high order. This presents significant challenges in applications where the number of adaptation weights M is very large.

Lastly, these techniques can be subdivided into sample-processing methods, where the processor weights are adapted every time a new input data sample is provided to the processor, and block-processing methods, where a block of input data is received and used to adapt the processor. In some cases, the algorithm may circulate through the data block multiple times before moving onto the next processing block. Again, the more powerful and effective adaptive processing methods employ block processing, typically with a block size N that is (in many cases, must be) a large multiple of M. However, the cost of this processing is reduced update rate; reduced response time to changes in channel effects affecting the adaptive processor; and (e.g., for multiple passes through the data block) additional increase in complexity.

It should also be noted that the operations referred to above are the "adapt-path" operations used to train the adaptive processor, not the "data-path" operations used to implement the adaptive processor during and after training. Adapt-path operations are used to tune the adaptive processor used to process a set of signals, while data-path operations are used to process a set of signals during and after tuning. For most of the applications described above (the DPD application being a notable exception), the data-path operations have O(M) complexity, regardless of the complexity of the adapt path.

To address the adapt-path complexity issue in particular, the concept of a partial update (PU) method (PUM; in the plural, PUMs) that only updates a subset of $M_1$ weights during each adaptation block or sample (referred to hereafter as a block with size N=1) has been proposed for a number of applications. All PUMs developed to date can be interpreted as linearly-constrained optimization techniques, in which the original method is adjusted by applying a hard linear constraint that forces $M_0=M-M_1$ weights to remain at the same value between adaptation blocks or samples. The subset of weights actually adapted during each data block, or during each of several passes through a data block, are changed during each adaptation event, so that every weight is updated over the course of multiple adaptation events.

This approach has substantive limitations in practice. First, the linear constraint, by its nature, can induce severe misadjustment from the optimal solution sought by the processor. This can manifest as either or both a convergent or steady-state bias from the optimal solution, and a "jitter" or fluctuation about that steady-state solution. In some applications, e.g., phased array radar applications where the received radar waveform must be extracted from strong clutter and jamming, this can cause the system to fail entirely (studies of PUMs showing "convergence-in-mean" to optimal solutions are almost always conducted under assumptions of little-or-no noise and removable multipath distortion). Even if the processor signal of interest is received at high signal-to-interference-and-noise ratio (SINR), this can lead to well-known "hypersensitivity" issues which degrades the system performance from the optimal solution.

Second, the linear optimization constraint can only be easily added to a small subset of $O(M^2)$ optimization functions, e.g., "least-squares (LS)" or LS-like methods that can be formulated as a quadratic optimization problem, or O(M) "least-mean-squares (LMS)" or LMS-like methods that are either intended to approximate LS optimization algorithms (e.g., by replacing gradients with "stochastic gradient" approximations), or that can themselves be formulated as linearly constrained quadratic optimization problems (e.g., "normalized LMS (NLMS)" and "Affine Projections" algorithms). In many cases, adherence to the constraint significantly increases complexity of the original method, and approximations, e.g., using Lagrange multipliers in which the multiplier itself is added to the algorithm, only increases the misadjustment of the algorithm.

In summary, the current PUMs developed to data can only be used with a small number of $O(M^2)$ methods, and cannot be used with any $O(M^v)$ methods where v>2. This is particularly unfortunate, because the PUM should have its strongest utility with these classes of methods. This is especially evident when the complexity of the data-path processing, which as noted above is typically O(M), is added to the adapt-path processing: at best for O(M) adapt-path methods, the PUM will only reduce overall complexity by 50%. This is the background in which the present invention takes form.

SUMMARY OF THE INVENTION

The present invention is a method for implementing partial-update methods (PUMs) in any adaptive processor that adjusts weights to optimize an adaptation criterion in a signal estimation or parameter estimation algorithm. In the preferred embodiment, the method does this by performing a linear transformation of the processor parameters being adapted from M-dimensions to $(M_1+L)$-dimensions in each adaptation event, where $M_1$ weights are updated without constraints, and $M_0=M-M_1$ weights are subjected to L soft constraints that forces them into an L-dimensional subspace spanned by those weights (preferentially, those weights are a scaled replica of the original weights) at the beginning of the adaptation event, and where $M_1$ and L are much smaller than M ($M_1 \ll M$ and $L \ll M$). Preferentially, L is equal to unity (L=1), i.e., the $M_0$ constrained weights are forced into a single-dimensional subspace spanned by those weights.

The same dimensionality reduction is also applied to the input data, using the same linear transformation. The reduced-dimensionality weights are then adapted using exactly the same optimization strategy employed by the adaptive processor, except with input data that has also been reduced in dimensionality.

BRIEF DESCRIPTION OF THE DRAWINGS

The present invention is illustrated in the attached drawings as described herein.

DETAILED DESCRIPTION OF THE DRAWINGS

Figure 1:
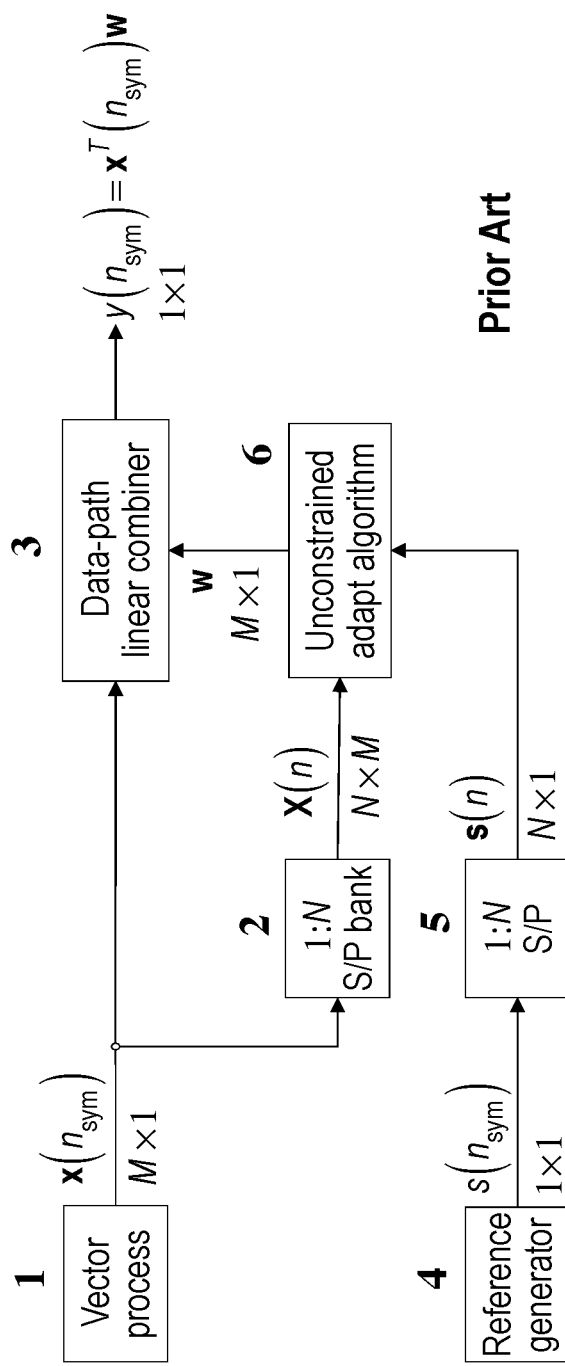
FIG. 1 is a view of an optimization approach used in a system employing a prior-art nonblind single-port unconstrained adaptation algorithm.

FIG. 1 is a view of an optimization approach used in a system employing a prior-art nonblind single-port unconstrained adaptation algorithm. On a first path, a vector processor [1] provides a sequence of data vectors $x(n_{sym})=[x_1(n_{sym}) \ldots x_M(n_{sym})]^T$, each data vector having dimension M×1, where $n_{sym}$ is a symbol index, and where M is a real positive integer, referred to here as the degrees-of-freedom (DoF's) of the system, and $(\bullet)^T$ denotes the matrix transpose operation. As part of a data-path processing procedure, the data vector sequence $x(n_{sym})$ is then passed through a linear combiner [3] that performs a matrix multiplication of $x(n_{sym})$ by a weight vector $w=[w_1 \ldots w_M]^T$ having dimension M×1, resulting in an output data scalar $y(n_{sym})=x^T(n_{sym})w$ having dimension N×1.

As part of an adapt-path processing procedure that is a focus of the invention, the data vector sequence $x(n_{sym})$ is also passed into a bank of M 1:N serial-to-parallel (S/P) convertors [2] that converts the vector data sequence into a sequence of data matrices $X(n)=[x(nN+1) \ldots x(nN+N)]^T$, each data matrix having dimension N×M, where N is a real-positive integer, referred to here as the block length of the adaptation algorithm, and n is an adapt block index.

On a second path, and also as part of an adapt-path processing procedure, a sequence of reference scalars $s(n_{sym})$ is provided by a reference generator [4], each reference scalar having dimension 1×1. In the nonblind adaptation algorithm shown in FIG. 1, the reference scalars $s(n_{sym})$ are known at the receiver, and are correlated with some component of the data vector $x(n_{sym})$ in some known manner; however, in other system implementations, the reference scalars may be members of a set of possible known received signal components, or may be derived from the output data vector in some manner.

The reference scalars are then passed into a single 1:N serial-to-parallel (S/P) convertor [5] that converts the scalar symbol sequence into a sequence of reference vectors s(n), each vector reference data symbol having dimension N×1. The reference vector s(n) is then compared with the data matrix X(n) (from the bank of M 1:N serial-to-parallel converters [2]) over each adapt block, and used to generate a weight vector w using an unconstrained adaptation algorithm [6] that adjusts every element of w to optimize a metric of similarity between the output data vector y(n)=X(n)w and the reference vector s(n), e.g., the sum-of-squares error metric $F(w;n)=\|s(n)-X(n)w\|_2^2$, where $\|\bullet\|_2$ denotes the L2 vector norm. The weights are then passed to the data-path processor [3], where they are used to process the input data vectors on a symbol-by-symbol basis.

It should be noted that the data matrices and reference vectors do not need to be contiguous, internally or between adapt blocks on the adapt-paths. However, the input data matrices and reference vectors should have internally consistent symbol indices.

Figure 2:
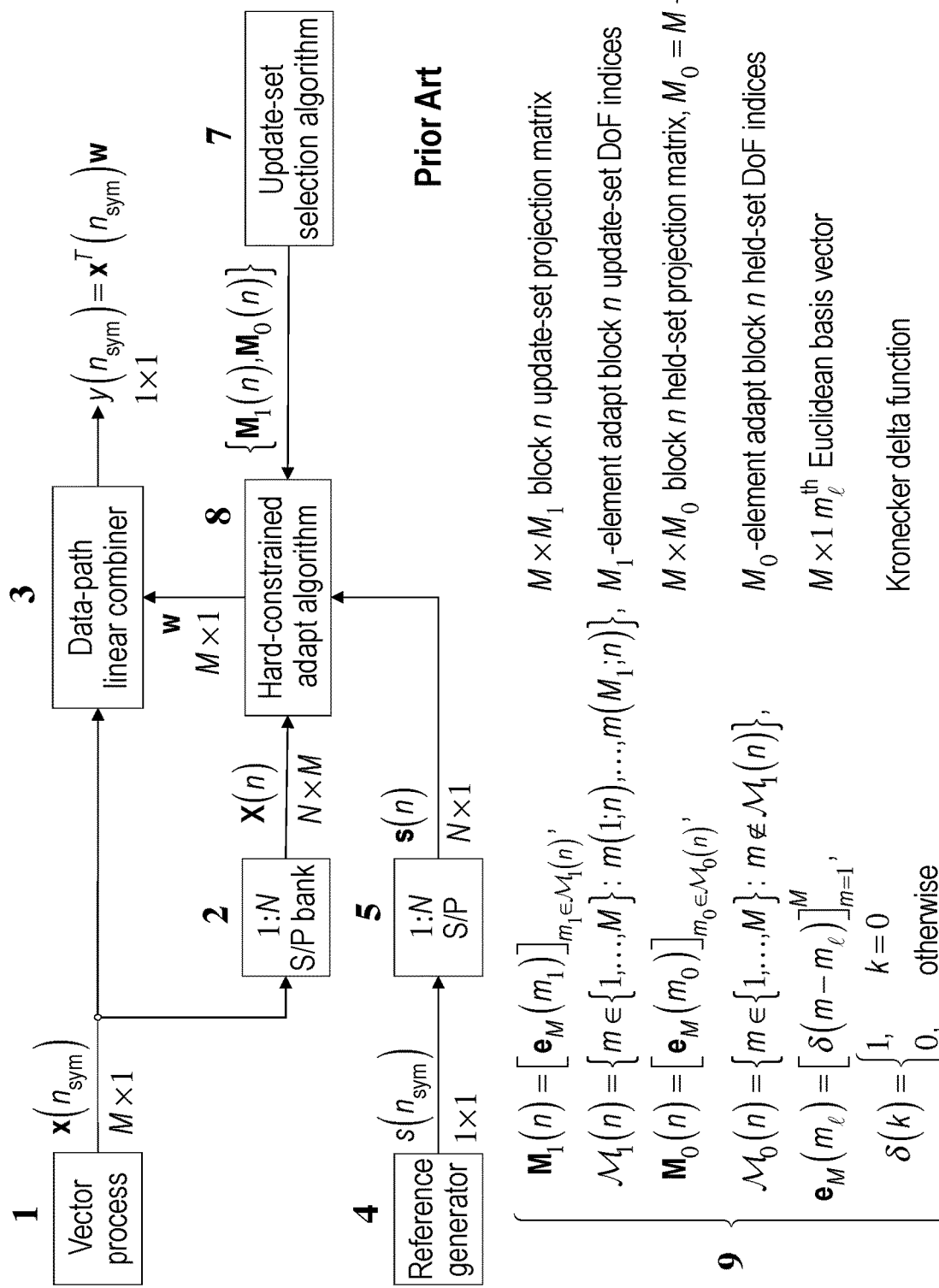
FIG. 2 is a view of an optimization approach used in a system employing a prior-art nonblind single-port partial-update (PU) adaptation algorithm.

FIG. 2 is a view of an optimization approach used in a system employing a prior-art nonblind single-port partial-update (PU) adaptation algorithm. On a first path, a vector processor [1] provides a sequence of data vectors $x(n_{sym})=[x_1(n_{sym}) \ldots x_M(n_{sym})]^T$, each data vector having dimension M×1, where $n_{sym}$ is a symbol index, and where M is a real positive integer, referred to here as the degrees-of-freedom (DoF's) of the system, and $(\bullet)^T$ denotes the matrix transpose operation. As part of a data-path processing procedure, the data vector sequence $x(n_{sym})$ is then passed through a linear combiner [3] that performs a matrix multiplication of $x(n_{sym})$ by a weight vector $w=[w_1 \ldots w_M]^T$ having dimension M×1, resulting in an output data scalar $y(n_{sym})=x^T(n_{sym})w$ having dimension N×1.

As part of an adapt-path processing procedure that is a focus of the invention, the data vector sequence $x(n_{sym})$ is also passed into a bank of M 1:N serial-to-parallel (S/P) convertors [2] that converts the vector data sequence into a sequence of data matrices $X(n)=[x(nN+1) \ldots x(nN+N)]^T$, each data matrix having dimension N×M, where N is a real-positive integer, referred to here as the block length of the adaptation algorithm, and n is an adapt block index.

On a second path, and also as part of an adapt-path processing procedure, a sequence of reference scalars $s(n_{sym})$ is provided by a reference generator [4], each reference scalar having dimension 1×1. In the nonblind adaptation algorithm shown in FIG. 2, the reference scalars $s(n_{sym})$ are known at the receiver, and are correlated with some component of the data vector $x(n_{sym})$ in some known manner; however, in other system implementations, the reference scalars may be members of a set of possible known received signal components, or may be derived from the output data vector in some manner.

The reference scalars are then passed into a single 1:N serial-to-parallel (S/P) convertor [5] that converts the scalar symbol sequence into a sequence of reference vectors s(n), each vector reference data symbol having dimension N×1.

On a third path, and also as part of an adapt-path processing procedure, an update-set selection algorithm [7] is used to generate a sequence of $M_1$-element update-sets $\mathcal{M}_1(n)+\{m \in \{1, \ldots, M\}: m(1;n), \ldots, m(M_1;n)\}$ and complementary $M_0$-element held-sets $\mathcal{M}_0(n)=\{m \in \{1, \ldots, M\}: m \notin \mathcal{M}_1(n)\}$ over each adapt block, such that $M_0=M-M_1$, $\mathcal{M}_0(n) \cup \mathcal{M}_1(n)=\{1, \ldots, M\}$, and $\mathcal{M}_0(n) \cap \mathcal{M}_1(n)=\{\}$ within adapt block n. The set selection strategy can be adjusted using deterministic, random, pseudo-random, or data-derived methods. In the partial-update optimization approach shown in FIG. 2, the update-set and held-set $\{\mathcal{M}_1(n), \mathcal{M}_0(n)\}$ are further used to generate update-set and held-set projection matrices [9] $\{M_1(n), M_0(n)\}$, where $M_\ell(n)=[e_M{}^{m_\ell}]_{m_\ell \in \mathcal{M}_\ell(n)}$ for $\ell=0, 1$, and where $e_M{}^{m_\ell}=[\delta(m-m_\ell)]_{m=1}^M$ is the $m_\ell^{th}$ M×1 Euclidean basis vector and $\delta(k)$ is the Kronecker delta function.

The reference vector s(n) is then compared with the data matrix X(n) over each adapt block, and used to generate a weight vector w using a hard-constrained adaptation algorithm [8] that adjusts only the elements of w in the update-set, i.e., $(w)_{m \in \mathcal{M}_1(n)}$, to optimize a metric of similarity between the output data vector y(n)=X(n)w and the reference vector s(n), e.g., the sum-of-squares error metric $F(w;n)=\|s(n)-X(n)w\|_2^2$, while holding the elements of w in the held-set, i.e., $(w)_{m \in \mathcal{M}_0(n)}$, equal to the same values held by those weight elements over the previous adapt block. This can be expressed as optimization of existing weight vector w to form new weight vector w', subject to hard linear constraint $M_0^T(n)w'=M_0^T(n)w$. The weights are then passed to the data-path processor [3], where they are used to process the input data vectors on a symbol-by-symbol basis.

It should be noted that the data matrices and reference vectors do not need to be contiguous, internally or between adapt blocks on the adapt-paths. However, the input data matrices and reference vectors should have internally consistent symbol indices.

Figure 3:
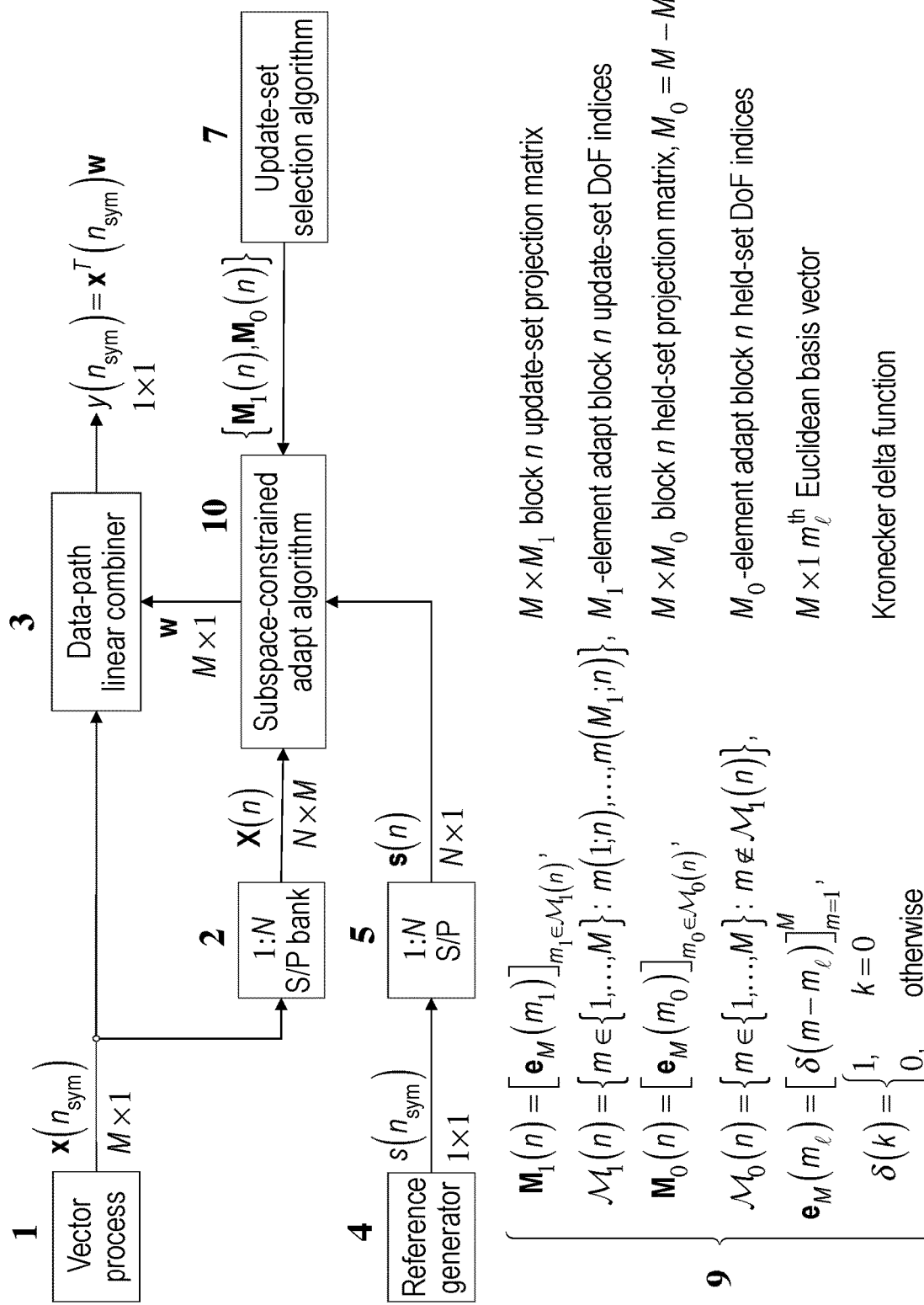
FIG. 3 is a view of an optimization approach used in a system employing a nonblind single-port subspace-constrained partial update (SCPU) adaptation algorithm.

FIG. 3 is a view of an optimization approach used in a system employing a new nonblind single-port subspace-constrained partial-update (SCPU) adaptation algorithm. On a first path, a vector processor [1] provides a sequence of data vectors $x(n_{sym})=[x_1(n_{sym}) \ldots x_M(n_{sym})]^T$, each data vector having dimension M×1, where $n_{sym}$ is a symbol index, and where M is a real) positive integer, referred to here as the degrees-of-freedom (DoF's) of the system, and $(\bullet)^T$ denotes the matrix transpose operation. As part of a data-path processing procedure, the data vector sequence $x(n_{sym})$ is then passed through a linear combiner [3] that performs a matrix multiplication of $x(n_{sym})$ by a weight vector $w=[w_1 \ldots w_M]^T$ having dimension M×1, resulting in an output data scalar $y(n_{sym})=x^T(n_{sym})w$ having dimension N×1.

As part of an adapt-path processing procedure that is a focus of the invention, the data vector sequence $x(n_{sym})$ is also passed into a bank of M 1:N serial-to-parallel (S/P)

convertors [2] that converts the vector data sequence into a sequence of data matrices $X(n)=[x(nN+1) \ldots x(nN+N)]^T$, each data matrix having dimension N×M, where N is a real-positive integer, referred to here as the block length of the adaptation algorithm, and n is an adapt block index.

On a second path, a sequence of reference scalars $s(n_{sym})$ is provided by a reference generator [4], each reference scalar having dimension 1×1. In the nonblind adaptation algorithm shown in FIG. 3, the reference scalars $s(n_{sym})$ are known at the receiver, and are correlated with some component of the data vector $x(n_{sym})$ in some known manner; however, in other system implementations, the reference scalars may be members of a set of possible known received signal components, or may be derived from the output data vector in some manner.

The reference scalars are then passed into a single 1:N serial-to-parallel (S/P) convertor [5] that converts the scalar symbol sequence into a sequence of reference vectors s(n), each vector reference data symbol having dimension N×1.

On a third path, an update-set selection algorithm [7] is used to generate a sequence of $M_1$-element update-sets $\mathcal{M}_1(n)=\{m\in\{1, \ldots, M\}: M(1;n), \ldots, m(M_1;n)\}$ and complementary $M_0$-element held-sets $\mathcal{M}_0(n)=\{\in\{1, \ldots, M\}: m\notin \mathcal{M}_1(n)\}$ over each adapt block, such that $M_0=M-M_1$, $\mathcal{M}_0(n)\cup\mathcal{M}_1(n)=\{1, \ldots, M\}$, and $\mathcal{M}_0(n)\cap\mathcal{M}_1(n)=\{\}$ within adapt block n. The set selection strategy can be adjusted using deterministic, random, pseudo-random, or data-derived methods. In the partial-update optimization approach shown in FIG. 3, the update-set and held-set $\{\mathcal{M}_1(n), \mathcal{M}_0(n)\}$ are further used to generate update-set and held-set projection matrices [9] $\{M_1(n), M_0(n)\}$, where $\mathbf{M}_\ell(n)=[e_{\mathcal{M}(m_\ell)}]_{m_\ell\in\mathcal{M}_\ell(n)}$ for $\ell=0, 1$, and where $e_\mathcal{M}(m_\ell)=[\delta(m-m_\ell)]_{m=1}^M$ is the $m_\ell^{th}$ M×1 Euclidean basis vector and $\delta(k)$ is the Kronecker delta function.

The reference vector s(n) is then compared with the data matrix X(n) over each adapt block, and used to generate a weight vector w using a subspace-constrained adaptation algorithm [10] that adjusts the elements of w in the update-set, i.e., $(w)_{m\in\mathcal{M}_1(n)}$, to optimize a metric of similarity between the output data vector y(n)=X(n)w and the reference vector s(n), e.g., the sum-of-squares error metric $F(w;n)=\|s(n)-X(n)w\|_2^2$, while optimizing the elements of w in the held-set, i.e., $(w)_{m\in\mathcal{M}_0(n)}$ to a scalar multiple of the values held by those weight elements over the previous adapt block. This can be expressed as optimization of existing weight vector w to form new weight vector w', subject to subspace constraint $M_0^T(n)w'=g_0M_0^T(n)w$, where $g_0$ is an unknown scalar that is also optimized by the algorithm. The weights are then passed to the data-path processor [3], where they are used to process the input data vectors on a symbol-by-symbol basis.

It should be noted that the data matrices and reference vectors do not need to be contiguous, internally or between adapt blocks on the adapt-paths. However, the input data matrices and reference vectors should have internally consistent symbol indices.

Figure 4:
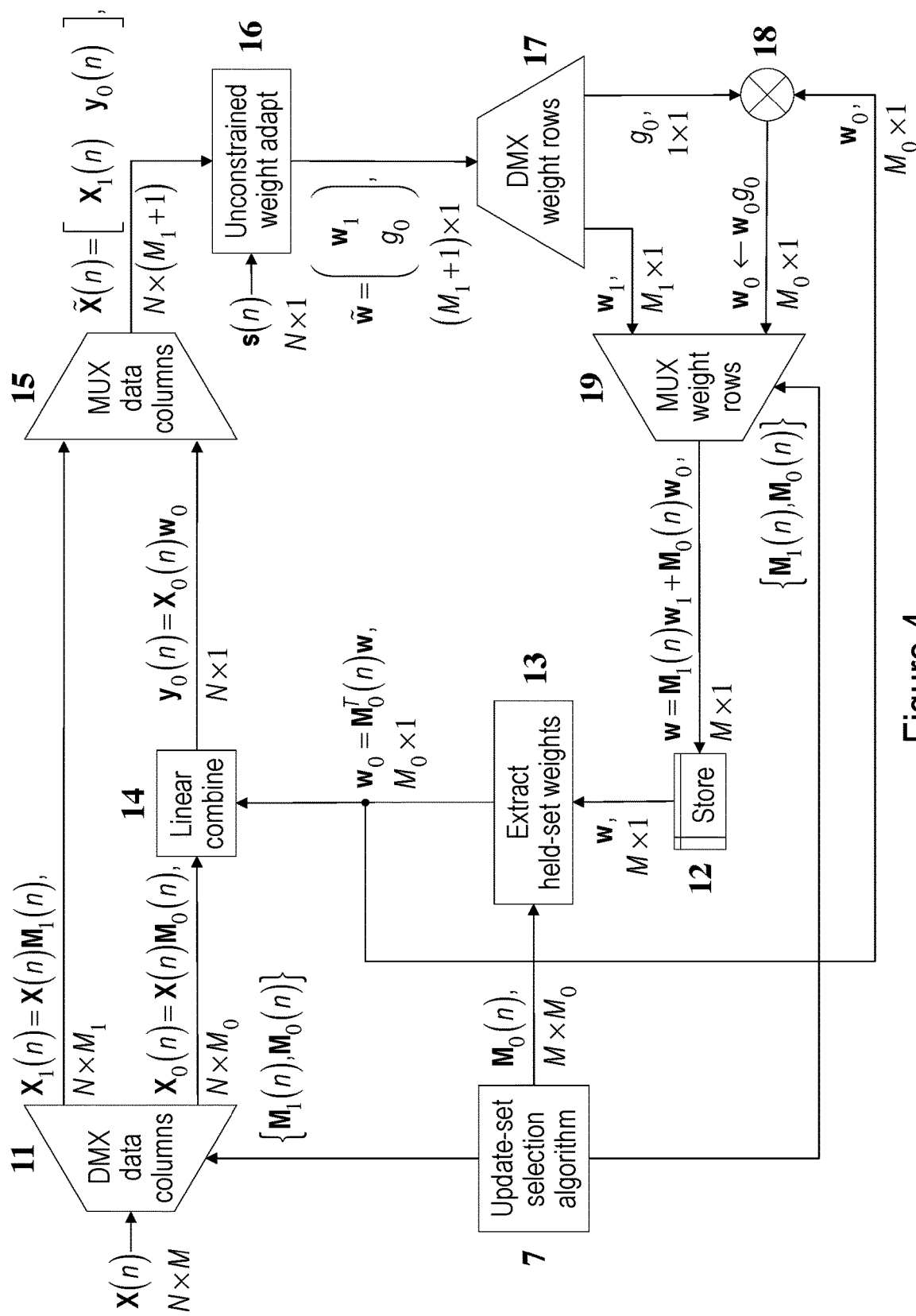
FIG. 4 is a view of a nonblind single-port SCPU adapt-path weight update procedure, depicting use of projection matrices (implemented using simple multiplexing and demultiplexing operations) to separate data and weights into unconstrained and subspace-constrained components, allowing use of an unconstrained single-port weight adaptation algorithm of arbitrary type and structure after the subspace separation procedure.

FIG. 4 is a view of a nonblind, single-port, SCPU adapt-path weight update method, depicting use of projection matrices (implemented using simple multiplexing and demultiplexing operations) to separate data and weights into unconstrained and subspace-constrained components, allowing use of an unconstrained single-port weight adaptation algorithm of arbitrary type and structure after the subspace separation procedure. Over adapt block n, the N×M data matrix X(n) provided by the 1:N S/P bank [2] (not shown) is separated into an N×$M_1$ dimensional update-set data matrix $X_1(n)=X(n)M_1(n)$ and an N×$M_0$ dimensional held-set data matrix $X_0(n)=X(n)M_0(n)$, using a columnar matrix demultiplexer (DMX) [11] and the update-set and held-set projection matrices provided over adapt block n [7].

An M×$M_0$ dimensional held-set projection matrix $M_0(n)$ is additionally used to extract the $M_0$×1 dimensional held-set combiner weights $w_0=M_0^T(n)w$ from the M×1 dimensional combiner weights w stored in current memory [12], e.g., computed in prior adapt blocks, using a held-set weight extractor [13]. These held-set combiner weights $w_0$ are used to multiply the held-set data matrix $X_0(n)$ from the columnar matrix demultiplexer (DMX) [11] through a linear combiner [14], yielding a N×1 held-set output data vector $y_0(n)=X_0(n)w_0$. $X_1(n)$ and $y_0(n)$ are then combined into an N×($M_1$+1) enhanced data matrix $X(n)=[X_1(n)\ y_0(n)]$ using a column-wise multiplexing (MUX) operation [15].

The enhanced data matrix X(n) is then input to an unconstrained weight adaptation algorithm [16] that adjusts every element of an ($M_1$+1)×1 enhanced combiner vector $$\tilde{w}=\begin{pmatrix} w_1 \\ g_0 \end{pmatrix}$$

to optimize a metric of similarity between an N×1 reference vector s(n) provided by a reference generator [4] (not shown) and an N×1 output data vector $y(n)=\tilde{X}(n)\tilde{w}$ that would be provided by an ($M_1$+1)-element linear combining operation (not shown). The unconstrained weight adaptation algorithm [16] optimizes the same metric as the unconstrained weight adaptation algorithm [6] depicted in prior art FIG. 1, e.g., the sum-of-squares error metric $F(w;n)=\|s(n)-\tilde{x}(n)\tilde{w}\|_2^2$. However, the complexity of the unconstrained weight adaptation algorithm is $O(M_1+1)^\nu$ in [16], rather than $O(M^\nu)$ in [6], where $\nu$ is the complexity order of the algorithm, e.g., $\nu=2$ if a sum-of-squares metric is used in both Figures.

The updated ($M_1$+1)×1 enhanced combiner vector $\tilde{w}$ is then demultiplexed (DMX'd) [17] into an updated $M_1$×1 update-set weight vector $w_1$ comprising the first $M_1$ elements of w, and a new held-set scalar multiplier $g_0$ comprising the last element of $\tilde{w}$. The held-set scalar multiplier $g_0$ is then multiplied by the current $M_0$×1 held-set weights $w_0$[18] to form updated held-set weights $w_0\leftarrow w_0g_0$, and multiplexed (MUX'd) [19] with the updated $M_1$×1 update-set weight vector $w_1$, in accordance with the current update-set selection algorithm [7], to form updated M×1 dimensional weight vector $w=M_1(n)w_1+M_0(n)w_0$. This weight vector is then stored in memory [12], allowing its use as an initial combiner weight vector in a subsequent adapt block. The weight vector can also be used in the data-path linear combiner (not shown) for parallel or subsequent data-path processing operations used in the overall system.

Figure 5:
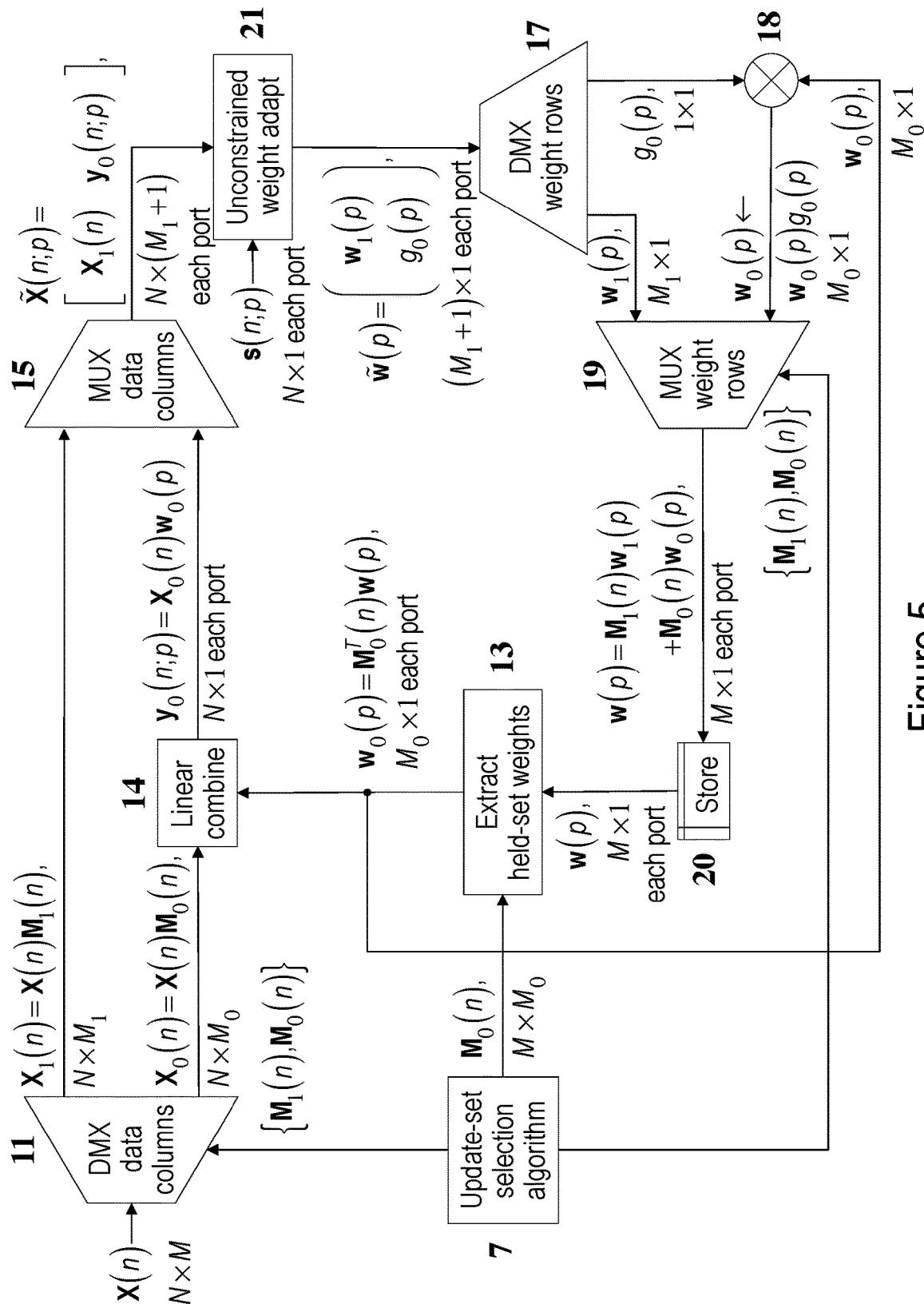
FIG. 5 is a view of a nonblind uncoupled multiport SCPU adapt-path weight update procedure, depicting use of projection matrices (implemented using simple multiplexing and demultiplexing operations) to separate data and weights into unconstrained and subspace-constrained components, allowing use of parallel banks of reduced-complexity unconstrained single-port weight adaptation algorithms of arbitrary type and structure after the subspace separation procedure.

FIG. 5 is a view of a nonblind, multiport, uncoupled SCPU adapt-path weight update method, depicting use of projection matrices (implementing using simple multiplexing and demultiplexing operations) to separate data and weights into unconstrained and subspace-constrained components, allowing use of parallel banks of reduced-complexity and unconstrained, single-port. weight adaptation algorithms of arbitrary type and structure after the subspace separation step. Over adapt block n, the N×M data matrix X(n) provided by the 1:N S/P bank [2] (not shown) is separated into an N×$M_1$ dimensional update-set data matrix $X_1(n)=X(n)M_1(n)$ and an N×$M_0$ dimensional held-set data matrix $X_0(n)=X(n)M_0(n)$, using a columnar matrix demultiplexer (DMX) [11] and the update-set and held-set projection matrices provided over adapt block n from the update-set selection algorithm [7]. On each output port p, where p=1, . . . , P where P is the number of weight ports adapted by the overall algorithm, the $M \times M_0$ dimensional held-set projection matrix $M_0(n)$ is additionally used to extract the $M_0 \times 1$ dimensional port p held-set combiner weights $w_0(p) = M_0^T(n)w(p)$ from the $M \times 1$ dimensional port p combiner weight vector w(p) stored in current memory [20], e.g., computed over a prior adapt block, using a held-set weight extractor [13]. The held-set data matrix $X_0(n)$ is then multiplied by the port p held-set combiner weights $w_0(p)$ from the held-set weight extractor [13] through a linear combiner [14], yielding $N \times 1$ $w_0(p)$ held-set output data vector $y_0(n; p) = X_0(n)w_0(p)$ for each port p. $X_1(n)$ and $y_0(n; p)$ are then combined into an $N \times (M_1 + 1)$ enhanced port p data matrix $\tilde{X}(n;p) = [X_1(n) \ y_0(n;p)]$ using a column-wise multiplexing (MUX) operation [15].

The port p enhanced data matrix is then input to an unconstrained weight adaptation algorithm [21] that adjusts every element of an $(M_1+1) \times 1$ port p enhanced combiner vector $$\tilde{w}(p) = \begin{pmatrix} w_1(p) \\ g_0(p) \end{pmatrix}$$

to optimize a metric of similarity between an $N \times 1$ port p reference vector s(n;p) provided by a reference generator [4] (not shown) and an $N \times 1$ output data vector $y(n;p) = \tilde{X}(n;p) \tilde{w}(p)$ that would be provided by an $(M_1+1)$-element linear combining operation (not shown). The unconstrained weight adaptation algorithm [21] optimizes the same metric as the unconstrained weight adaptation algorithm [6] depicted in prior art FIG. 1, e.g., the sum-of-squares error metric $F(w; n,p) = \|s(n;p) - \tilde{X}(n;p)\tilde{w}\|_2^2$. However, the complexity of the unconstrained weight adaptation algorithm is $O(M_1+1)^v)$ in [21], rather than $O(M^v)$ in [6], where $v$ is the complexity order of the algorithm, e.g., $v=2$ if a sum-of-squares metric is used in both Figures. Additionally, the weight adaptation algorithm can exploit commonality between the enhanced data matrices $\{\tilde{X}(n;p)\}_{p=1}^P$, i.e., the common update-set data matrix $X_1(n)$ contained within each enhanced data matrix, to share results of operations on $X_1(n)$ performed for each algorithm port, resulting in an additional reduction on computational complexity for the overall multiport processor. The updated $(M_1+1) \times 1$ port p enhanced combiner vector $\tilde{w}(p)$ is then demultiplexed (DMX'd) [17] into an updated $M_1 \times 1$ port p update-set weight vector $w_1(p)$ comprising the first $M_1$ elements of $\tilde{w}(p)$, and a new port p held-set scalar multiplier $g_0(p)$ comprising the last element of $\tilde{w}(p)$. The held-set scalar multiplier $g_0(p)$ is then multiplied by the current (from the held-set weight extractor [13]) $M_0 \times 1$ port p held-set weights $w_0(p)$ [18] to form updated port p held-set weights $w_0(p) \leftarrow w_0(p)g_0(p)$, and multiplexed (MUX'd) [19] with the updated $M_1 \times 1$ port p update-set weight vector $w_1(p)$, in accordance with the current update-set selection algorithm [7], to form updated $M \times 1$ dimensional port p weight vector $w(p) = M_1(n)w_1(p) + M_0(n)w_0(p)$. This weight vector is then stored in memory [20], allowing its use as an initial combiner weight vector in a subsequent adapt block. The weight vector can also be used in a port p data-path linear combiner (not shown) for parallel or subsequent data-path processing operations used in the overall system.

Figure 6:
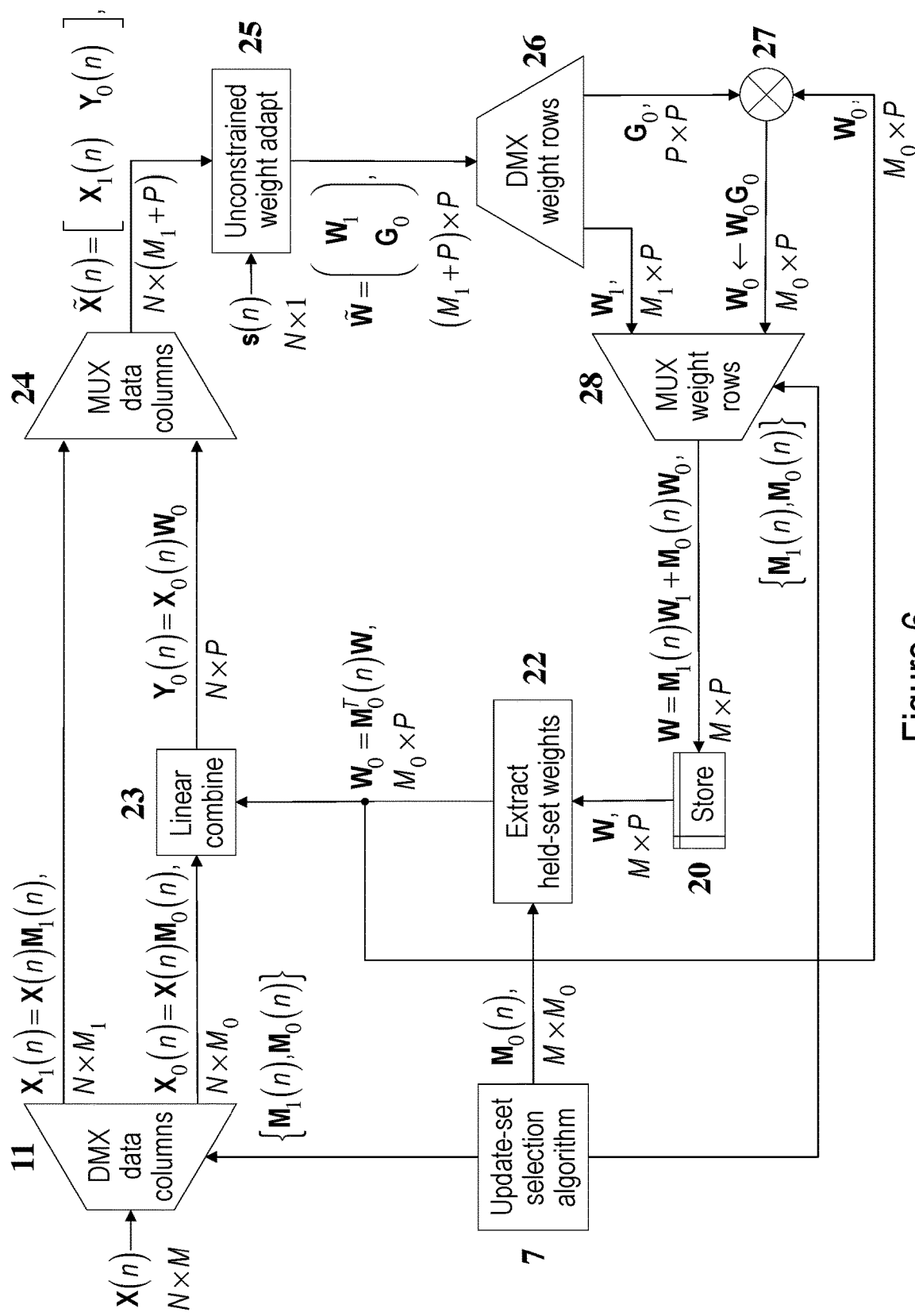
FIG. 6 is a view of a nonblind fully-coupled multiport SCPU adapt-path weight update procedure, depicting use of projection matrices (implemented using simple multiplexing and demultiplexing operations) to separate data and weights into unconstrained and subspace-constrained components, allowing use of an unconstrained multiport weight adaptation algorithm of arbitrary type and structure after the subspace separation procedure.

FIG. 6 is a view of a nonblind, multiport, fully-coupled SCPU adapt path weight update method, depicting use of projection matrices (implemented using simple multiplexing and demultiplexing operations) to separate data and weights into unconstrained and subspace-constrained components, allowing use of an unconstrained multiport weight adaptation algorithm of arbitrary type and structure after the subspace separation procedure. Over adapt block n, the $N \times M$ data matrix X(n) provided by the 1:N S/P bank [2] (not shown) is separated into an $N \times M_1$ dimensional update-set data matrix $X_1(n) = X(n)M_1(n)$ and an $N \times M_0$ dimensional held-set data matrix $X_0(n) = X(n)M_0(n)$, using a columnar matrix demultiplexer (DMX) [11] and the update-set and held-set projection matrices provided over adapt block n from the update-set selection algorithm [7]. The $M \times M_0$ dimensional held-set projection matrix $M_0(n)$ is additionally used to extract the $M_0 \times P$ dimensional held-set combiner weights $W_0 = M_0^T(n)W$ from the $M \times P$ dimensional combiner weight matrix W stored in current memory [20], e.g., computed over a prior adapt block, using a held-set multiport weight extractor [22]. The held-set data matrix $X_0(n)$ is then multiplied by the $M_0 \times P$ held-set multiport combiner weights $W_0$ through a linear combiner [23], yielding $N \times P$ multiport held-set output data matrix $Y_0(n) = X_0(n)W_0$. $X_1(n)$ and $Y_0(n)$ are then combined into an $N \times (M_1+P)$ dimensional enhanced data matrix $X(n) = [X_1(n) \ Y_0(n)]$ using a column-wise multiplexing (MUX) operation [24].

The enhanced data matrix is then input to an unconstrained multiport weight adaptation algorithm [25] that adjusts every element of $(M_1+P) \times P$ enhanced multiport combiner matrix $$\tilde{W}(p) = \begin{pmatrix} W_1 \\ G_0 \end{pmatrix}$$

to optimize a metric of similarity between an $N \times P$ reference vector S(n) provided by a multiport reference generator (not shown) and an $N \times P$ output data matrix $Y(n) = \tilde{x}(n)\tilde{W}$ that would be provided by an $(M_1+P) \times P$ element linear combining operation (not shown), e.g., the sum-of-squares error metric $F(\tilde{W};n) = \|S(n) - \tilde{X}(n)\tilde{W}\|_F^2$, where $\|\cdot\|_F$ denotes the Frobenius matrix norm. However, the complexity of the unconstrained weight adaptation algorithm is $O(P(M_1+P)^v)$ in [25], where $v$ is the complexity order of the algorithm, e.g., $v=2$ if a sum-of-squares metric is used to optimize $\tilde{W}$.

The updated $(M_1+P) \times P$ dimensional enhanced combiner matrix $\tilde{W}$ is then demultiplexed (DMX'd) [26] into an updated $M_1 \times P$ dimensional update-set weight matrix $W_1$ comprising the first $M_1$ rows of $\tilde{W}$, and a new $P \times P$ dimensional held-set multiplier matrix $G_0$ comprising the last P rows of $\tilde{W}$. The held-set multiplier matrix $G_0$ is then multiplied by the current $M_0 \times P$ held-set weights $W_0$ [27] to form updated held-set weights $W_0 \leftarrow W_0 G_0$, and multiplexed (MUX'd) [28] with the updated $M_1 \times P$ update-set weight matrix $W_1$, in accordance with the current update-set selection algorithm [7], to form updated $M \times P$ dimensional weight matrix $W = M_1(n)W_1 + M_0(n)W_0$. This weight matrix is then stored in memory [20], allowing its use as an initial combiner weight matrix in a subsequent adapt block. The weight matrix can also be used in a multiport data-path linear combiner (not shown) for parallel or subsequent data-path processing operations used in the overall system.

DETAILED DESCRIPTION OF EXEMPLARY EMBODIMENTS

A method for processing digital signals by any adaptive processor (as a single element or set of interacting elements, and whether entirely embodied in physical hardware or in a combined form of hardware, special-purpose firmware, and general processing purpose software applied to effect digital signal processing) that adjusts signal weights on the digital signal(s) transmitted, received, or both, by or through said adaptive processor, in order to optimize an adaptation criteria responsive to a functional purpose or the externalities (transient, temporary, situational, and even permanent) for that processor, is explained. This adaptation criteria for the adaptive algorithm may be any of a signal or parameter estimation, measured quality, or any combination thereof.

This method performs a linear transformation of the processor parameters being adapted from M-dimensions to $(M_1+L)$-dimensions in each adaptation event, where $M_1 \ll M$ and $L \ll M$ such that $M_1$ weights are updated without constraints and $M_0 = M - M_1$ weights are subjected to soft constraints that forces them into an L-dimensional subspace spanned by those weights at the beginning of the adaptation period. The same dimensionality reduction, using the same linear transformation, is applied to the input data. The reduced-dimensionality weights are then adapted using the same optimization strategy employed by the adaptive processor, except with input data that has also been reduced in dimensionality. In a preferred embodiment the reduced-dimensionality weights are then adapted using exactly the same optimization strategy. In alternative embodiment, as when there exists any of hardware, software, or combined hardware and software differentiation in "adapt-path" operations used to tune the adaptive processor and "data-path" operations used by the adaptive processor during and after tuning, the method will be adapting the reduced-dimensionality weights using substantively the same optimization strategy employed by the adaptive processor for the input data to which the same dimensionality reduction has been applied.

The invention has numerous advantages over the conventional PU approach. These include:
- Substantive reduction or elimination of misadjustment effects induced by the hard linear constraint employed in the conventional PU method.
- Applicability to any optimization function, including functions based on optimal (maximum-likelihood, maximum a priori, minimum-mean-square) estimation strategies, and methods such as analytic constant modulus algorithm (ACMA) and cumulant based techniques that have very high-order complexity.
- Ability to reduce adapt block size N significantly, e.g., to N<M, even when the unconstrained approach experiences instability issues at that block size.
- Ability to develop optimization quality measures, e.g., Cramer-Rao bound on parameter or signal estimation performance, that also exploits the dimensionality reduction, and that can track the performance degradation (relative to the unconstrained solution) induced by the partial update.
- Ability to operate with much lower update set sizes than conventional PU, resulting in further reduction in complexity, and therefore cost, of adapt-path processing.
- Ability to be implemented in highly distributed processing architectures, e.g., general-purpose graphical processing units (GPGPU's), that can further exploit the reduced complexity of the approach, or allow processing over multiple parallel update sets with minimal intercommunication between units.
- Applicability to other problems where dimensionality is a known limitation, e.g., pattern recognition over feature sets with large numbers of parameters.

The approach can be used with any update-set selection strategy developed to date, or with new methods exploiting quality measurement advantages of the approach.

The invention is motivated by interpreting prior-art partial-update approaches as hard-constrained optimization algorithms, in which a complex combiner weight vector w having dimension M×1 is updated to optimize metric F(w;n) over adapt block n, i.e., $$w \leftarrow \arg\ \underset{w' \in \mathbb{C}^M}{opt}\ F(w'; n), \quad \text{(Eq1)}$$

subject to additional linear constraint $$(w')_{m \in \mathcal{M}_0} = (w)_{m \in \mathcal{M}_0} \quad \text{(Eq2)}$$

where $\mathcal{M}_0(n)=\{m \in \{1, \ldots, M\}: m(1;n), \ldots, m(M_0;n)\}$, referred to here as the block n held-set, is a set of $M_0 < M$ indices of weights held constant over adapt block n, and where w in (Eq2) is the combiner weights at the beginning of the adapt block. This resultant constrained optimization criterion can be written in compact matrix algebra as $$w \leftarrow \arg\ \underset{w' \in \mathbb{C}^M}{opt}\ \{F(w'; n) \ni M_0(n)w' = M_0(n)w\} \quad \text{(Eq3)}$$

where $M_0(n)=[e_m(m_0)]_{m_0 \in \mathcal{M}_0(n)}$ is the $M \times M_0$ sparse held-set projection matrix, and where $e_M(m_0)=[\delta(m-m_0)]_{m=1}^M$ is the $m_0^{th}$ M×1 Euclidean basis vector and $\delta(k)$ is the Kronecker delta function. Example prior-art partial-update algorithms that can be expressed in this manner include:

The partial-update normalized least-mean-squares (PU-NLMS) algorithm, which modifies the normalized least-mean-squares (NLMS) algorithm taught in [Nagumo67]

$$y(n) = x^T(n)w, \quad \text{(Eq4)}$$

$$w \leftarrow w + \mu \frac{x^*(n)}{\|x(n)\|_2^2}(s(n) - y(n)), \ 0 < \mu \leq 1 \quad \text{(Eq5)}$$

$$= \arg\ \underset{w' \in \mathbb{C}^M}{\min}\ \|w' - w\|_2^2 \ni x^T(n)w' = \hat{s}(n), \quad \text{(Eq6)}$$

$$\hat{s}(n) = \mu s(n) + (1-\mu)y(n), \ 0 < \mu \leq 1 \quad \text{(Eq7)}$$

at adapt symbol index n, where x(n) is an M×1 data vector defined over adapt symbol index n, s(n) is a reference scalar known over adapt symbol index $n_{sym}$, μ is the NLMS adaptive stepsize, and $\|\cdot\|_2$ is the L-2 norm, and where $(\cdot)^T$ and $(\cdot)^*$ denote the matrix transpose and complex conjugation operations, respectively. Addition of the held-set weight-update constraint $$M_0(n)\tilde{w}' = M_0(n)w, \quad \text{(Eq8)}$$

to (Eq6) yields the PU-NLMS algorithm taught in [Douglas94,Schertler98,Dogancay01], $$y(n) = x^T(n)w, \quad \text{(Eq9)}$$

$$W_\ell = M_\ell^T(n)w, \ \ell = 0,1 \quad \text{(Eq10)}$$

$$X_\ell(n) = M_\ell^T(n)x(n), \ \ell = 0,1 \quad \text{(Eq11)}$$

$$w_1 \leftarrow w_1 + \mu \frac{x_1^*(n)}{\|x(n)\|_2^2}(s(n) - y(n)), \ 0 < \mu \leq 1, \quad \text{(Eq12)}$$

-continued $$w \leftarrow M_1(n)w_1 + M_0(n)w_0 \quad (\text{Eq}13)$$

where $M_1(n)=[e_M(m_1)]_{m_1 \in \mathcal{M}_1(n)}$ is the $M \times M_1$ update-set projection matrix defined over adapt symbol n, and where $\mathcal{M}_1(n)=\{m \in \{1, \ldots, M\}: m \notin \mathcal{M}_0(n)\}$ is the complementary update-set defined over adapt symbol n.

The partial-update affine projections (PU-AP) algorithm, which modifies the affine projection algorithm taught in [Ozeki84,Gay93]

$$y(n) = X(n)w, \quad (\text{Eq}14)$$

$$w \leftarrow w + \mu X^\dagger(n) - (s(n) - y(n)), \; 0 < \mu \leq 1, \quad (\text{Eq}15)$$

$$= \arg\min_{w' \in \mathbb{C}^M} \|w' - w\|_2^2 \ni X(n)w' = \hat{s}(n), \quad (\text{Eq}16)$$

$$\hat{s}(n) = \mu s(n) + (1-\mu)y(n), \; 0 < \mu \leq 1, \quad (\text{Eq}17)$$

over N-symbol adapt block n, $1 \leq N \leq M$, where $X(n)=[x(nN+1) \ldots x(nN+N)]^T$ is an $N \times M$ data matrix defined over adapt block n, $s(n)=[s(nN+1) \ldots s(nN+N)]^T$ is a known $N \times 1$ reference vector defined over adapt block n, $\mu$ is an adaptive stepsize, and $(\bullet)^\dagger$ denotes the matrix pseudoinverse operation, given by $$X^\dagger(n) = X^H(n)(X(n)X^H(n))^{-1}, \quad (\text{Eq}18)$$

for rank$\{X(n)\}=N \leq M$, and where $(\bullet)^H$ and $(\bullet)^{-1}$ denote the matrix conjugate-transpose (Hermitian) and inverse operations, respectively. Addition of constraint (Eq8) to (Eq16) yields the PU-AP taught in [Naylor04], $$y(n) = X(n)w, \quad (\text{Eq}19)$$

$$\mathbf{w}_\ell = \mathsf{M}_\ell^T(n)w, \; \ell = 0,1, \quad (\text{Eq}20)$$

$$\mathbf{X}_\ell(n) = X(n)\mathsf{M}_\ell(n), \; \ell = 0,1, \quad (\text{Eq}21)$$

$$w_1 \leftarrow w_1 + \mu X_1^\dagger(n)(s(n)-y(n)), \; 0 < \mu \leq 1, \quad (\text{Eq}22)$$

$$w \leftarrow M_1(n)w_1 + M_0(n)w_0. \quad (\text{Eq}23)$$

The partial-update block least-squares (PU-BLS) algorithm, which modifies the block least-squares (BLS) algorithm given by $$y(n) = X(n)w, \quad (\text{Eq}24)$$

$$w \leftarrow (1-\mu)w + \mu X^\dagger(n)s(n), \quad (\text{Eq}25)$$

$$= \arg\min_{w' \in \mathbb{C}^M} \|\hat{s}(n) - X(n)w'\|_2^2, \; \begin{cases} \hat{s}(n) = \mu\hat{s}(n) + (1-\mu)y(n) \\ y(n) = X(n)w \end{cases} \quad (\text{Eq}26)$$

over N-symbol adapt block n, $N \geq M$, where $\|\bullet\|_2$ is the L–2 norm and $\mu$ is the AP adaptive stepsize, and where $X(n)=[x(nN+1) \ldots x(nN+N)]^T$ is an $N \times M$ data matrix defined over adapt block n, $s(n)=[s(nN+1) \ldots s(nN+N)]^T$ is a known $N \times 1$ reference vector defined over adapt block n, and $(\bullet)^\dagger$ denotes the matrix pseudoinverse operation, given by $$X^\dagger(n) = (X^H(n)X(n))^{-1}X^H(n) \quad (\text{Eq}27)$$

for rank $\{X(n)\}=M \leq N$. Addition of constraint (Eq8) to (Eq26) yields PU-BLS algorithm $$y(n) = X(n)w, \quad (\text{Eq}28)$$

$$\mathbf{w}_\ell = \mathsf{M}_\ell^T(n)w, \; \ell = 0,1, \quad (\text{Eq}29)$$

$$\mathbf{X}_\ell(n) = X(n)\mathsf{M}_\ell(n), \; \ell = 0,1, \quad (\text{Eq}30)$$

$$w_1 \leftarrow (1-\mu)w_1 + \mu X_1^\dagger(n)(s(n)-y(n)), \; 0 < \mu \leq 1, \quad (\text{Eq}31)$$

$$w \leftarrow M_1(n)w_1 + M_0(n)w_0. \quad (\text{Eq}32)$$

The BLS and PU-BLS algorithms can be interpreted as extensions of the AP and PU-AP algorithms to adapt block sizes $N \geq M$. Similarly, the NLMS and PU-NLMS algorithms can be interpreted as implementations of the AP and PU-AP algorithms for N=1.

A number of observations can immediately be made from this interpretation of the partial-update procedure. First, any linear constraint can induce severe misadjustment from the optimal solution sought by the processor. This can manifest as both a convergent or steady-state bias from the optimal solution, and a "jitter" or fluctuation about that steady-state solution. In some applications, e.g., phased array radar applications where the received radar waveform must be extracted from strong clutter and jamming, this can cause the system to fail entirely. Even if the reference signal is received at high SINR, this can lead to well-known "hypersensitivity" issues that degrade system performance from the optimal solution.

Second, the linear constraint can only be easily added to a small subset of optimization functions. In many cases, strict enforcement of the constraint significantly increases complexity of the original method.

The subspace-constrained approach overcomes both of these problems, by replacing the hard linear constraint $M_0(n)w'=M_0(n)w$ with a softer subspace constraint $$M_0^T(n)w' \propto M_0^T(n)w \quad (\text{Eq}33)$$
$$= M_0^T(n)wg_0, \; g_0 \in \mathbb{C},$$

where the scalar held-set multiplier $g_0$ and the update-set weights $w_1=M_1(n)w$ are jointly adjusted to optimize the unconstrained criterion given in (Eq1), i.e., by adapting $(M_1+1) \times 1$ enhanced weight vector $$\tilde{w} = \begin{pmatrix} w_1 \\ g_0 \end{pmatrix}$$

using optimization formula $$\tilde{w} \leftarrow \arg\,\mathop{opt}_{\tilde{w}' \in \mathbb{C}^{M_1+1}} F(\tilde{w}'; n) \quad (\text{Eq}34)$$

over each data block. The full output weight vector is then given by $$w = M_1(n)w_1 + M_0(n)w_0 g_0, \quad (\text{Eq}35)$$

which is efficiently computed using vector-scalar multiplies and multiply-free multiplexing (MUX) operations.

For the exemplary NLMS, AP, and BLS optimization criteria given in (Eq6), (Eq16), and (Eq26), respectively, the SCPU algorithms are implemented using the following procedure:

Separate w into update-set and held-set components $w_1$ and $w_0$ using multiply-free demultiplexing (DMX) operations.

For the SCPU-AP/NLMS algorithms, and for the SCPU-BLS algorithm with $\mu<1$, construct $(M_1+1)\times 1$ dimensional weight matrix $$\tilde{w} = \begin{pmatrix} w_1 \\ 1 \end{pmatrix}. \tag{Eq36}$$

Separate $X(n)$ into update-set and held-set components $X_1(n)$ and $X_0(n)$ using multiply-free columnar DMX operations.

Compute $y_0(n)=X_0(n)w_0$. For the SCPU-AP/NLMS algorithms, further compute $y_1(n)=X_1(n)w_1$ and $y(n)=y_1(n)+y_0(n)$.

Construct $N\times(M_1+1)$ dimensional SCPU data matrix $$\tilde{X}(n) = [X_1(n)\ y_0(n)]. \tag{Eq37}$$

Note that $y(n)=\tilde{X}(n)\tilde{w}$ constructs the output data from the prior weight set.

Optimize $\tilde{w}$ using the original unconstrained algorithm, with dimensionality reduced from $M$ to $M_1+1$, yielding $$\text{SCPU-}AP\text{: } \tilde{w} \leftarrow \tilde{w} + \mu \tilde{x}^\dagger(n)(s(n)-y(n)),\ 0<\mu\le 1 \tag{Eq38}$$

$$\text{SCPU-}BLS\text{: } \tilde{w} \leftarrow (1-\mu)\tilde{w} + \mu \tilde{X}^\dagger(n)s(n),\ 0<\mu\le 1, \tag{Eq39}$$

where the SCPU-AP algorithm degenerates to SCPU-NLMS if $N=1$, and extends to SCPU-BLS if $N\ge M_1$. Update $w_1$ and $w_0$ using formula $$w_1 \leftarrow [(\tilde{w})_m]_{m=1}^{M_1} \tag{Eq40}$$

$$w_0 \leftarrow g_0 w_0,\ g_0 = (\tilde{w})_{M_1+1}, \tag{Eq41}$$

where $(\tilde{w})_m$ denotes the $m^{th}$ element of vector $\tilde{w}$.

Reconstruct the linear combiner weights using.

$$w = M_1(n)w_1 + M_0(n)w_0. \tag{Eq42}$$

The SCPU approach employs a data matrix with a nominal dimensionality increase of one over the equivalent PU data matrix, and requires an additional $M_0$ complex multiplies to update the held-set weight vector. This complexity increase is substantive for the PU-NLMS algorithm, which has $O(M)$ complexity on the data path and $O(M_1)$ complexity on the adapt path. However, this complexity increase is minor for the PU-BLS algorithm, which has $O(M_1^2)$ complexity on the adapt path, and for the PU-AP algorithm if the adapt block size $N$ is less than but on the order of the number of updated weights $M_1$ ($N\le M_1$). Because the SCPU approach optimizes $g_0=(\tilde{w})_{M_1+1}$ over the complex field, the algorithm is also guaranteed to have lower misadjustment than the equivalent PU method, which constrains $g_0$ to unity.

This implementation of a SCPU algorithm obtains a higher degree of efficiency (in comparison with either an unconstrained partial update, or full update algorithm) through reducing the level of repetitive processing and comparison which is needed to obtain the maximally-beneficial level, and mixture, of signal weightings that, when applied to the next processing effort, will produce the correct answer within the noise constraints. If applied so as to remove arbitrarily-imposed limits on either the processing depth, or on the number of criteria to be evaluated, then a satisficing level of accuracy can be reached without sacrificing the capacities which were otherwise artificially constrained. Since the weighting dimensionality is reduced by and to the level of the constraints on the subspace, without changing the data path, the efficiency of the transforming process is improved over the full analytical processing effort.

The SCPU algorithm employs a data matrix with a nominal dimensionality increase of one over the equivalent partial-update (PU) data matrix, and which employs an additional $O(M_0)$ complex scalar-vector multiplier to update the held-set weight vector. This can be expressed in the following compact matrix notation:

$$\tilde{M}(n) = [M_1(n)\ M_0(n)M_0^T(n)w] \tag{Eq43}$$

$$\tilde{X}(n) = X(n)\tilde{M}(n) \tag{Eq44}$$

$$\tilde{w} = \arg\ \underset{\tilde{w}\in\mathbb{C}^{M_1+1}}{opt}\ F(\tilde{w};n) \tag{Eq45}$$

$$y(n) = \tilde{X}(n)\tilde{w} \tag{Eq46}$$

$$w \leftarrow \tilde{M}(n)\tilde{w}, \tag{Eq47}$$

where $\tilde{M}(n)$ is an $M\times(M_1+1)$ sparse mapping matrix that reduces dimensionality of $X(n)$ ahead of the optimization algorithm described symbolically in (Eq45).

This compact notation reveals some additional advantages of the approach:

The approach is inherently more stable than the unconstrained algorithm on a block-by-block basis, because it updates fewer weights than the unconstrained method, without introducing explicit hard constraints that lead to adaptive "jitter." Hypersensitivity effects due to large noise subspaces in the received data should be especially reduced in the SCPU method.

The approach is usable with any optimization criterion, including non-quadratic criteria such as general and analytic constant modulus cost functions [Treichler83, Agee86,Van Der Veen 96], cumulant based objective functions, and eigenvalue-based objective functions [Agee89b,Agee90].

The approach admits both SCPU maximum-likelihood signal and parameter estimation approaches, and reduced-complexity, constrained quality metrics such as signal-to-interference-and-noise ratio (SINR), Cramer-Rao bounds on parameter estimates, and information-theoretic channel capacity. These metrics may lead to new update-set selection strategies that can overcome identified issues with methods developed to date.

The mapping given in (Eq43) can be extended in many ways to enhance other attributes of the algorithm, e.g., ability to track multiple signals, new selection strategies, and so on. In particular, the approach immediately yields nonblind multiport extensions in which adaptation algorithms are used to extract multiple signals from a received environment.

Two multiport extensions of the AP and BLS methods are taught here based on the unconstrained nonblind algorithms given by $$AP\text{: } W \leftarrow W + \mu X^\dagger(n)(S(n)-Y(n)), \tag{Eq47}$$

$$BLS\text{: } W \leftarrow (1-\mu)W + \mu X^\dagger(n)S(n), \tag{Eq48}$$

where $W$ is an $M\times P$ combiner matrix, $Y(n)=X(n)W$ is an $N\times P$ matrix of combiner output data formed over adapt block $n$ using $W$, and $S(n)$ is an $N\times P$ matrix of reference data known over adapt block $n$. These multiport extensions include the following:

An uncoupled multiport extension in which (Eq43) is replaced by P separate mapping matrices $$\tilde{M}(n;p) = [M_1(n) M_0(n) M_0^T(n) w(p)], \quad p=1, \ldots, P, \quad (Eq49)$$

$$\tilde{X}(n;p) = X(n)\tilde{M}(n;p), \quad p=1, \ldots, P, \quad (Eq50)$$

i.e., the SCPU constraint (Eq33) is broadened to P separate constraints $$M_0^T(n)\tilde{w}(p) = M_0^T(n)w(p)g_0(p) \in \mathbb{C}, \quad p=1, \ldots, P. \quad (Eq51)$$

The uncoupled SCPU-BLS algorithm is then given by $$\tilde{X}(n;p) = X(n)\tilde{M}(n;p) \quad (Eq52)$$

$$\tilde{w}(p) = \begin{pmatrix} M_1^T(n)w(p) \\ 1 \end{pmatrix} \quad (Eq53)$$

$$\tilde{w}(p) \leftarrow (1-\mu)\tilde{w}(p) + \mu \tilde{X}^\dagger(n;p)s(n;p), \quad 0 < \mu \le 1 \quad (Eq54)$$

$$y(n;p) = \tilde{X}(n;p)\tilde{w}(p) \quad (Eq55)$$

$$w(p) \leftarrow \tilde{M}(n;p)\tilde{w}(p) \quad (Eq56)$$

for each port $p=1, \ldots, P$ where $s(n;p)$ and $w(p)$ are the $p^{th}$ column of $S(n)$ and $W$, respectively, and where (Eq53) is only needed if $\mu < 1$.

A fully-coupled multiport extension, in which (Eq43) is replaced by global mapping matrix $$\tilde{M}(n) = [M_1(n) M_0(n) M_0^T(n) W], \quad (Eq57)$$

i.e., the SCPU constraint (Eq33) is broadened to $$M_0^T(n)W' = M_0^T(n)WG_0, \quad G_0 \in \mathbb{C}^{P \times P} \quad (Eq58)$$

The fully-coupled SCPU-BLS algorithm is then given by $$\tilde{X}(n) = X(n)\tilde{M}(n), \quad (Eq59)$$

$$\tilde{W} = \begin{pmatrix} M_1^T(n)W \\ I_P \end{pmatrix} \quad (Eq60)$$

$$\tilde{W} \leftarrow (1-\mu)\tilde{W} + \mu \tilde{X}^\dagger(n)S(n), \quad 0 < \mu \le 1 \quad (Eq61)$$

$$Y(n) = \tilde{X}(n)\tilde{W} \quad (Eq62)$$

$$W \leftarrow \tilde{M}(n)\tilde{W}, \quad (Eq63)$$

and where (Eq60) is only needed if $\mu < 1$.

In an efficient embodiment, the uncoupled multiport SCPU-BLS extension is implemented using whitening methods that exploit the common components of $\{\tilde{X}(n;p)\}_{p=1}^P$, i.e., the $N \times M_1$ dimensional update-set data matrix $X_1(n) = X(n)M_1(n)$.

In particular, using the QR decomposition of $\tilde{X}(n;p)$, given by $$\{Q, R\} = QRD(X), \quad \begin{cases} R = \text{chol}\{X^H X\} \\ Q = XR^{-1} \end{cases} \quad (Eq64)$$

$$\Rightarrow \begin{cases} X = QR \\ Q^H Q = I_N \end{cases} \quad (Eq65)$$

for general $N \times M$ matrix $X$ with $\text{rank}\{X\} = N \ge M$, where $I_N$ is the $N \times N$ identity matrix and $\text{chol}\{\cdot\}$ is the Cholesky decomposition yielding upper-triangular matrix $R$ with real-positive diagonal values, then the uncoupled multiport SCPU-BLS algorithm given in (Eq54) can be efficiently implemented by first computing the QRD of the common update-set data matrix, $$\{Q_1, R_{11}\} = QRD(X_1(n)), \quad (Eq66)$$

and then updating each port p using the recursion $$y_0 \leftarrow X_0(n)w_0(p) \quad (Eq67)$$

$$r_{10} \leftarrow Q_1^H y_0 \quad (Eq68)$$

$$u_1 \leftarrow Q_1^H s(n;p) \quad (Eq69)$$

$$g_0(p) \leftarrow \frac{y_0^H s(n;p) - r_{10}^H u_1}{\|y_0\|_2^2 - \|r_{10}\|_2^2} \quad (Eq70)$$

$$w_1(p) \leftarrow (1-\mu)w_1(p) + \mu R_{11}^{-1}(u_1 - r_{10}g_0(p)), \quad 0 < \mu \le 1 \quad (Eq71)$$

$$g_0(p) \leftarrow (1-\mu) + \mu g_0(p), \quad 0 < \mu \le 1 \quad (Eq72)$$

where $$\tilde{w}(p) = \begin{pmatrix} w_1(p) \\ g_0(p) \end{pmatrix}.$$

This recursion also admits unbiased quality statistic $$\hat{\gamma}_{max}(n;p) = \left(1 - \frac{M_1+1}{N}\right)\left(\frac{\tilde{\eta}}{1-\tilde{\eta}}\right) - \frac{M_1+1}{N}, \quad \tilde{\eta} = \frac{\|u_1\|_2^2 + |u_0|^2}{\|s(n;p)\|_2^2} \quad (Eq73)$$

for each port p, which estimates the relative power between the port p reference signal and background clutter at the output of the port p linear combiner, also referred to as the signal-and-interference-and-noise ratio (SINR) of the combiner output signal.

The SCPU method is also easily extended to partially blind methods in which the reference vector s(n) is partially known at the receive processor over adapt block n, e.g., the reference vector has an unknown carrier or timing offset relative to the sequence contained in the input data sequence, and to fully blind methods in which the reference vector is unknown but has some known, exploitable structure. Specific examples include:

Carrier-timing tracking SCPU-BLS algorithms, in which s(n) has an unknown timing and/or carrier offset, e.g., due to propagation delay, Doppler shift and carrier LO uncertainty between the input data and an original transmitted signal containing the reference signal, or a combined frequency shift due to timing and carrier offset if the input data is derived from an OFDM or OFDMA demodulation process. This algorithm replaces the nonblind weight adaptation algorithm given in (Eq39) with $$\tilde{w} \leftarrow (1-\mu)\tilde{w} + \mu \tilde{X}^\dagger(n)(s(\hat{n}_{off};n) \circ \delta(\hat{\omega}_{off})) \quad (Eq74)$$

$$s(n_{off};n) = [s(nN + n_{sym} + n_{off})]_{n_{sym}=1}^N \quad (Eq75)$$

$$\delta(\omega_{off}) = [e^{j\omega_{off} n_{sym}}]_{n_{sym}=1}^N \quad (Eq76)$$

where $\{s(n_{sym})\}$ is a component of the transmitted signal that is known over the adapt block except for timing offset $n_{off}$ and a carrier offset $\omega_{off}$, and where "∘" is the element-wise matrix multiplication operation. The timing and carrier offset can be optimized over each adapt block by setting $$\{\hat{\omega}_{off}(n), \hat{n}_{off}(n)\} = \arg\max_{\omega_{off}, n_{off}} \eta(\omega_{off}, n_{off}; n), \quad \text{(Eq77)}$$

$$\eta(\omega_{off}, n_{off}; n) = \frac{\left\|\tilde{Q}^H(n)(s(n_{off}; n) \circ \delta(\omega_{off}))\right\|_2^2}{\|s(n_{off}; n)\|_2^2}, \quad \text{(Eq78)}$$

$$= \frac{\left\|\sum_{n_{sym}=1}^{N} \tilde{q}^*(n_{sym})s(nN + n_{sym} + n_{off})e^{j\omega_{off}n_{sym}}\right\|_2^2}{\sum_{n_{sym}=1}^{N} |s(nN + n_{sym} + n_{off})|^2}, \quad \text{(Eq79)}$$

where $\tilde{Q}=[\tilde{q}(1) \ldots \tilde{q}(N)]^T$ is the Q-component of the QRD of $\tilde{x}(n)$. Equation (Eq77) can be efficiently implemented using fast Fourier transform (FFT) methods if the frequency offset ω is completely unknown (acquisition phases), and using Gauss-Newton or Newton methods if the frequency offset ω is known closely (tracking phases).

Equation (Eq77) also admits quality statistic $$\tilde{\gamma}(\omega_{off}, n_{off}; n) = \left(1 - \frac{M_1+1}{N}\right)\left(\frac{\tilde{\eta}(\omega_{off}, n_{off}; n)}{1 - \tilde{\eta}(\omega_{off}, n_{off}; n)}\right) - \frac{M_1+1}{N}, \quad \text{(Eq80)}$$

which estimates the SINR of the combiner output signal.

Property-mapping SCPU-BLS algorithms, in which s(n) is a member of a known property set. These algorithms replace the nonblind weight adaptation algorithm given in (Eq39) with property-mapping recursion $$y(n) = \tilde{X}(n)\tilde{w} \quad \text{(Eq81)}$$

$$\hat{s}(n) = \arg\min_{s \in \mathcal{D}(n)} \|s - y(n)\| \quad \text{(Eq82)}$$

$$\tilde{w} \leftarrow (1-\mu)\tilde{w} + \mu \tilde{X}^\dagger(n)\hat{s}(n), \quad \text{(Eq83)}$$

where $\mathcal{D}(n)$ is a desired signal set, potentially variable as a function of adapt block n, that s(n) is known to belong to. For example, the constant modulus property set: $\mathcal{D}(n)=\{z \in \mathbb{C}^N: |(z)_n|=1\}$ yields $$\hat{s}(n) = \text{sgn}\{y(n)\} \quad \text{(Eq84)}$$

where sgn{.} is the element-wise complex sign function sgn{z}=z/|z| on each element, resulting in an SCPU-BLS constant-modulus algorithm. Other exemplary mappings include known modulus mappings in which the elements of s(n) have known magnitude but unknown phase, and decision-direction mappings in which each element of s(n) belongs to a known set of finite values, possibly with an unknown carrier offset.

In all cases, the property-mapping algorithm is applicable to cases in which s(n) does not perfectly possess the property used by the algorithm, but substantively conforms to that property, e.g., $|s(nN+n_{sym})| \approx 1$.

Dominant-mode prediction (DMP) algorithms, in which s(n) is known to be substantively present in a linear subspace with known or estimable structure, such that $$s(n) \approx (U_s(n)U_s^H(n))s(n) \quad \text{(Eq85)}$$

for a known or postulated N×N$_s$(n) orthonormal basis $U_s(n)$, $N_s(n)<N$, and/or such that s(n) is known to be substantively absent a linear subspace with known or estimable structure, such that $$U_\perp^H(n)s(n) \approx 0 \quad \text{(Eq86)}$$

for a known or postulated complementary N×N$_\perp$(n) orthonormal basis $U_\perp(n)$, in which $N_s(n)+N_\perp(n) \leq N$. If only one subspace is available, one can be derived from the other, for example by deriving $U_\perp(n)$ from $I_N - (U_s(n)U_s^H(n))$ or vice versa.

In this case, the enhanced weight update algorithm is given by $$\tilde{w} = \arg\max_{w \in \mathbb{C}^{M_1+1}} \tilde{\gamma}(w; n), \quad \text{(Eq87)}$$

$$\tilde{\gamma}(w; n) = \frac{w^H(\tilde{X}_s^H(n)\tilde{X}_s(n))w}{w^H(\tilde{X}_\perp^H(n)\tilde{X}_\perp(n))w}, \quad \begin{cases} \tilde{X}_s(n) = U_s^H(n)\tilde{X}(n) \\ \tilde{X}_\perp(n) = U_\perp^H(n)\tilde{X}(n) \end{cases}. \quad \text{(Eq88)}$$

The enhanced combiner weights $\tilde{w}_{max}$ that maximize (Eq88), and the maximal value of (Eq88), $\tilde{\gamma}_{max}$, are equal to the dominant solution $\{\tilde{\gamma}_1, \tilde{w}_1\}$ of the DMP eigenequation, $$\tilde{\gamma}_m(\tilde{X}_\perp^H(n)\tilde{X}_\perp(n))\tilde{w}_m = (\tilde{X}_s^H(n)\tilde{X}_s(n))\tilde{w}_m, \tilde{\gamma}_m \geq \tilde{\gamma}_{m+1} \quad \text{(Eq89)}$$

The dominant eigenvalue $\tilde{\gamma}_1$ also provides an estimate of the SINR of the combiner output signal, and can be used both to detect the target signal, and to search over postulated subspaces to find the subspace that most closely contains or rejects s(n).

Example subspaces include:

Known or postulated time slots used by s(n), such that $|s(nN+n_{sym})| \ll 1/N \|s(n)\|_2$ over some known or searchable subset of symbol indices within the adapt block. This generates SCPU time-gated DMP (TG-DMP) algorithms.

Known or postulated frequency channels used by s(n), such that $$\frac{\left|\sum_{n_{sym}=1}^{N-1} h(n_{sym})s(nN+n_{sym})e^{-j\omega n_{sym}}\right|^2}{\sum_{n_{sym}=1}^{N-1} h^2(n_{sym}) \sum_{n_{sym}=1}^{N-1} h(n_{sym})|s(nN+n_{sym})|^2} \ll 1 \quad \text{(Eq90)}$$

over a known or searchable subset of frequency offsets $\{\omega_\perp\}$, where $$\{h(n_{sym})\}_{n_{sym}=1}^{N}$$

is a lowpass windowing function, e.g., a Gaussian or Hamming sym window. This generates SCPU frequency-gated DMP (FG-DMP) algorithms.

Known or postulated CDMA codes used by s(n), such that $$\frac{\left|\sum_{n_{sym}=1}^{N-1} c^*(n_{sym}-n_{off})s(nN+n_{sym})e^{-j\omega_{off}n_{sym}}\right|^2}{\sum_{n_{sym}=1}^{N-1} |c(n_{sym}-n_{off})|^2 \sum_{n_{sym}=1}^{N-1} |s(nN+n_{sym})|^2} \approx 1 \quad \text{(Eq91)}$$

over a known or searchable subset of carrier offsets $\{\omega_{off}\}$ and timing offsets $\{n_{off}\}$, where $\{c(n_{sym})\}$ is a known spreading code. This generates SCPU code-gated DMP (CG-DMP) algorithms.

Known or postulated restricted isometry properties (RIP) possessed by s(n), such that it occupies a sparse subset of a basis $U_s$ that is known (oracular basis), or that satisfies some sparsity property (general RIP). This generates adaptive decompression algorithms in compressed sensing applications.

Conjugate self-coherence restoral (C-SCORE) algorithms, in which s(n) is known to have substantive conjugate self-coherence at some known or estimable frequency offset $\omega$, such that $$\frac{\left|\sum_{n_{sym}=1}^{N} s^2(nN + n_{sym})e^{-j\omega n_{sym}}\right|}{\sum_{n_{sym}=1}^{N} |s(nN + n_{sym})|^2} \approx 1 \qquad (Eq92)$$

In this case, the enhanced weight update algorithm is given by $$\tilde{w} = \arg\max_{w \in \mathbb{C}^{M_1+1}} \tilde{\rho}(w|\omega; n), \qquad (Eq93)$$

$$\tilde{\rho}(w|\omega; n) = \frac{\left|w^H\left(\tilde{X}^H(n)\Delta(\omega)\tilde{X}^*(n)\right)w^*\right|}{w^H\left(\tilde{X}^H(n)\tilde{X}(n)\right)w}, \qquad (Eq94)$$

$$\Delta(\omega) = \mathrm{diag}\{e^{j\omega n_{sym}}\}_{n_{sym}=1}^{N}$$

for a postulated twice-carrier offset $\omega$. The enhanced combiner weights $\tilde{w}_{max}$ that maximize (Eq94), and the maximal value of (Eq88), $\tilde{\rho}_{max}(\omega;n)$, are equal to the dominant solution $\{\tilde{\rho}_1(\omega), \tilde{w}_1(\omega)\}$ of the C-SCORE pseudo-eigenequation, $$\tilde{\rho}_m(\omega)(\tilde{X}^H(n)\tilde{X}(n))\tilde{w}_m(\omega) = (\tilde{X}^H(n)\Delta(\omega)\tilde{X}^*(n))\tilde{w}^*_m(\omega),$$
$$\tilde{\rho}_m \geq \tilde{\rho}_{m+1}. \qquad (Eq95)$$

The SC-PU C-SCORE algorithm is expected to have application to BPSK, MSK, and GMSK signals, such as 1 Mbps (BPSK) 802.11 DSSS signal. The algorithm also extends to both carrier-tracking algorithms where an FFT-based search algorithm. In this case, the line spectrum used to detect the SOI's will either be the dominant pseudoeigenmode $\tilde{\rho}_{max}(\omega;n)$.

Extensions of all of these algorithms to fully-coupled and uncoupled multiport SCPU methods is straightforward.

It should also be recognized that, while all of the techniques described here are defined over the "complex field," such that $w \in \mathbb{C}^M$, they are equally applicable combiners and optimization metrics defined over other fields, including the real field, e.g., $w \in \mathbb{R}^M$, and Galois fields usable in integer field codes. In each case, the subspace constraint $$M_0^T(n)w' \propto M_0^T(n)w \qquad (Eq96)$$
$$= M_0^T(n)wg_0, \; g_0 \in \mathbb{S},$$

where $\mathbb{S}$ is the field in which each element of w is defined, results in a valid SCPU method. The method is also applicable to linear-conjugate-linear (LCL) methods $$\overline{M}_0^T(n)\overline{w}' \propto \overline{M}_0^T(n)\overline{w}, \begin{cases} \overline{w} = \frac{1}{\sqrt{2}}\begin{pmatrix} w \\ w^* \end{pmatrix} \\ \overline{M}_\ell(n) = [M_\ell(n) \; M_\ell(n)] \end{cases} \qquad (Eq97)$$

$$= \overline{M}_0^T(n)\overline{w}\overline{g}_0, \; \overline{g}_0 = \frac{1}{\sqrt{2}}\begin{pmatrix} g_0 \\ g_0^* \end{pmatrix},$$

which allows the SCPU method to be applied to optimization functions that are more complicated functions of complex variables. Moreover the techniques are applicable to processors that implement nonlinear functions on the data path as well as the adapt path, if the original optimization constraint is a linear function of w. In a preferred embodiment the step of performing a dimensionality reduction comprising a linear transformation of the processor parameters being adapted from M-dimensions to $(M_1+L)$-dimensions in each adaptation event comprises applying a subspace constraint described in the form:

$$M_0^T(n)w' \propto M_0^T(n)w \qquad (Eq98)$$
$$= M_0^T(n)wg_0 \qquad (Eq99)$$

While this invention is susceptible of embodiment in many different forms, there is shown in the drawings and will herein be described in detail several specific embodiments with the understanding that the present disclosure is to be considered as an exemplification of the principles of the invention and is not intended to limit the invention to the embodiments illustrated.

Some of the above-described functions may be composed of instructions, or depend upon and use data, that are stored on storage media (e.g., computer-readable medium). The instructions and/or data may be retrieved and executed by the processor. Some examples of storage media are memory devices, tapes, disks, and the like. The instructions are operational when executed by the processor to direct the processor to operate in accord with the invention; and the data is used when it forms part of any instruction or result therefrom.

The terms "computer-readable storage medium" and "computer-readable storage media" as used herein refer to any medium or media that participate in providing instructions to a CPU for execution. Such media can take many forms, including, but not limited to, non-volatile (also known as 'static' or 'long-term') media, volatile media and transmission media. Non-volatile media include, for example, one or more optical or magnetic disks, such as a fixed disk, or a hard drive. Volatile media include dynamic memory, such as system RAM or transmission or bus 'buffers'. Common forms of computer-readable media include, for example, a floppy disk, a flexible disk, a hard disk, magnetic tape, any other magnetic medium, a CD-ROM disk, digital video disk (DVD), any other optical medium, any other physical medium with patterns of marks or holes.

"Memory", as used herein when referencing to computers, is the functional hardware that for the period of use retains a specific structure which can be and is used by the computer to represent the coding, whether data or instruction, which the computer uses to perform its function. Memory thus can be volatile or static, and be any of a RAM, a PROM, an EPROM, an EEPROM, a FLASH EPROM, any other memory chip or cartridge, a carrier wave, or any other medium from which a computer can read data, instructions, or both.

"I/O", or 'input/output', is any means whereby the computer can exchange information with the world external to the computer. This can include a wired, wireless, acoustic, infrared, or other communications link (including specifically voice or data telephony); a keyboard, tablet, camera, video input, audio input, pen, or other sensor; and a display (2D or 3D, plasma, LED, CRT, tactile, or audio). That which allows another device, or a human, to interact with and exchange data with, or control and command, a computer, is an I/O device, without which any computer (or human) is essentially in a solipsitic solipsistic state.

The above description of the invention is illustrative and not restrictive. Many variations of the invention may become apparent to those of skill in the art upon review of this disclosure. The scope of the invention should, therefore, be determined not with reference to the above description, but instead should be determined with reference to the appended claims along with their full scope of equivalents.

While the present invention has been described in connection with at least one preferred embodiment, these descriptions are not intended to limit the scope of the invention to the particular forms (whether elements of any device or architecture, or steps of any method) set forth herein. It will be further understood that the elements, or steps in methods, of the invention are not necessarily limited to the discrete elements or steps, or the precise connectivity of the elements or order of the steps described, particularly where elements or steps which are part of the prior art are not referenced (and are not claimed). To the contrary, the present descriptions are intended to cover such alternatives, modifications, and equivalents as may be included within the spirit and scope of the invention as defined by the appended claims and otherwise appreciated by one of ordinary skill in the art.

The invention claimed is:

1. A method of implementing partial updates in an adaptive processor that adjusts weights to optimize an adaptation criterion in a signal estimation or parameter estimation algorithm, the method comprising:
    selecting, from a set of weights, a set of update weights and a set of held weights;
    performing unconstrained updates to the set of update weights; and
    performing updates to the set of held weights within a reduced-dimensionality subspace, wherein performing updates to the set of held weights and performing unconstrained updates to the set of update weights uses adapt-path operations for tuning the adaptive processor to process signal data during or after tuning.

2. The method of claim 1, wherein performing unconstrained updates to the set of update weights and performing updates to the set of held weights comprises constructing a set of enhanced weights from the set of update weights and a projection of the set of held weights onto the reduced dimensionality subspace, and performing an unconstrained update to the set of enhanced weights.

3. The method of claim 1, wherein performing unconstrained updates to the set of update weights and performing updates to the set of held weights comprises at least one of performing a single-port partial-update adaptation algorithm, an uncoupled multiport adapt-path weight update algorithm, a fully-coupled multiport adapt-path weight update algorithm, a partial-update normalized least-mean-squares algorithm, a partial-update affine projections algorithm, a partial-update block least-squares algorithm, a non-blind update weight adaptation algorithm, a partially blind update weight adaptation algorithm, a fully blind update weight adaptation algorithm, a carrier-timing tracking algorithm, a property-mapping algorithm, a dominant-mode prediction algorithm, a self-coherence restoral algorithm, a QR decomposition algorithm, an eigenvalue-based algorithm, a data dimensionality reduction method, a QR-based method, or a linear-conjugate-linear algorithm.

4. The method of claim 3, wherein the uncoupled multiport adapt-path weight update algorithm uses parallel banks of single-port weight adaptation algorithms.

5. The method of claim 1, wherein selecting comprises a set-selection strategy that is deterministic, random, pseudo-random, or data-derived.

6. The method of claim 1, wherein performing updates to the set of held weights within a reduced-dimensionality subspace comprises updating a dimensionality-reduction strategy.

7. The method of claim 1, wherein performing updates to the set of held weights is configured to employ an optimization strategy of arbitrary type and structure.

8. The method of claim 1, wherein performing updates to the set of held weights employs at least one of a set of optimization strategies, the set comprising maximum-likelihood estimation, maximum a priori estimation, minimum-mean-square estimation, an analytic constant modulus algorithm, a cumulant based algorithm, and an eigenvalue-based obj ective function.

9. The method of claim 1, wherein the adaptive processor is configured to perform at least one of echo cancellation and noise cancellation.

10. The method of claim 1, wherein the adaptive processor is configured to process signals in a phased array, a Multiple Input Multiple Output (MIMO) radar, a MIMO wireless network, a massive MIMO cellular network, or a predistortion processor.

11. The method of claim 1, wherein the adaptive processor is configured to perform pattern recognition over feature sets comprising a plurality of parameters.

12. A non-transitory computer-readable medium having computer readable program code stored thereon, the computer readable program code being executable by at least one adaptive processor for:
    selecting, from a set of weights, a set of update weights and a set of held weights;
    performing unconstrained updates to the set of update weights; and
    performing updates to the set of held weights within a reduced-dimensionality subspace, wherein performing updates to the set of held weights and performing unconstrained updates to the set of update weights uses adapt-path operations for tuning the adaptive processor to process signal data during or after tuning.

13. The non-transitory computer-readable medium of claim 12, wherein performing unconstrained updates to the set of update weights and performing updates to the set of held weights comprises constructing a set of enhanced weights from the set of update weights and a projection of the set of held weights onto the reduced dimensionality subspace, and performing an unconstrained update to the set of enhanced weights.

14. The non-transitory computer-readable medium of claim 12, wherein performing unconstrained updates to the set of update weights and performing updates to the set of held weights comprises at least one of performing a single-port partial-update adaptation algorithm, an uncoupled multiport adapt-path weight update algorithm, a fully-coupled multiport adapt-path weight update algorithm, a partial-update normalized least-mean-squares algorithm, a partial-update affine projections algorithm, a partial-update block least-squares algorithm, a non-blind update weight adaptation algorithm, a partially blind update weight adaptation algorithm, a fully blind update weight adaptation algorithm, a carrier-timing tracking algorithm, a property-mapping algorithm, a dominant-mode prediction algorithm, a self-coherence restoral algorithm, a QR decomposition algorithm, an eigenvalue-based algorithm, a data dimensionality reduction method, a QR-based method, or a linear-conjugate-linear algorithm.

15. The non-transitory computer-readable medium of claim 12, wherein the uncoupled multiport adapt-path weight update algorithm uses parallel banks of single-port weight adaptation algorithms.

16. The non-transitory computer-readable medium of claim 12, wherein selecting comprises a set-selection strategy that is deterministic, random, pseudo-random, or data-derived.

17. The non-transitory computer-readable medium of claim 12, wherein performing updates to the set of held weights within a reduced-dimensionality subspace comprises updating a dimensionality-reduction strategy.

18. The non-transitory computer-readable medium of claim 12, wherein performing updates to the set of held weights is configured to employ an optimization strategy of arbitrary type and structure.

19. The non-transitory computer-readable medium of claim 12, wherein performing updates to the set of held weights employs at least one of a set of optimization strategies, the set comprising maximum-likelihood estimation, maximum a priori estimation, minimum-mean-square estimation, an analytic constant modulus algorithm, a cumulant based algorithm, and an eigenvalue-based objective function.

20. The non-transitory computer-readable medium of claim 12, further comprising computer readable program code that is executable by the at least one adaptive processor to perform at least one of echo cancellation and noise cancellation.

21. The non-transitory computer-readable medium of claim 12, further comprising computer readable program code that is executable by the at least one adaptive processor to process signals in a phased array, a Multiple Input Multiple Output (MIMO) radar, a MIMO wireless network, a massive MIMO cellular network, or a predistortion processor.

22. The non-transitory computer-readable medium of claim 12, further comprising computer readable program code that is executable by the at least one adaptive processor to perform pattern recognition over feature sets comprising a plurality of parameters.

23. The non-transitory computer-readable medium of claim 12, further comprising computer readable program code that is executable by the at least one adaptive processor to apply the set of update weights and the set of held weights to the signal data to be processed in the signal estimation or parameter estimation algorithm, which outputs a signal estimate or a parameter estimate.

* * * * *